(12) United States Patent
Oboukhov et al.

(10) Patent No.: US 11,764,813 B1
(45) Date of Patent: Sep. 19, 2023

(54) EXTENDABLE PARITY CODE MATRIX CONSTRUCTION AND UTILIZATION IN A DATA STORAGE DEVICE

(71) Applicant: Western Digital Technologies, Inc., San Jose, CA (US)

(72) Inventors: Iouri Oboukhov, Rochester, MN (US); Derrick Burton, Irvine, CA (US); Weldon M. Hanson, Rochester, MN (US); Richard Galbraith, Rochester, MN (US); Niranjay Ravindran, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/834,219

(22) Filed: Jun. 7, 2022

(51) Int. Cl.
| | | |
|---|---|---|
| *H03M 13/35* | (2006.01) | |
| *H03M 13/37* | (2006.01) | |
| *H03M 13/11* | (2006.01) | |
| *H03M 13/01* | (2006.01) | |
| *H03M 13/00* | (2006.01) | |

(52) U.S. Cl.
CPC ....... *H03M 13/35* (2013.01); *H03M 13/1148* (2013.01); *H03M 13/3715* (2013.01); *H03M 13/015* (2013.01); *H03M 13/616* (2013.01); *H03M 13/6566* (2013.01)

(58) Field of Classification Search
CPC .......................... H03M 13/35; H03M 13/3715
See application file for complete search history.

(56) References Cited

U.S. PATENT DOCUMENTS

| | | | | |
|---|---|---|---|---|
| 4,870,645 A | * | 9/1989 | Herron | G11B 20/1833 |
| | | | | 714/755 |
| 5,224,106 A | * | 6/1993 | Weng | H03M 13/29 |
| | | | | 714/755 |
| 5,233,584 A | * | 8/1993 | Kulakowski | G11B 27/36 |
| | | | | 369/44.29 |
| 7,107,505 B2 | * | 9/2006 | Thesling, III | H03M 13/2742 |
| | | | | 714/701 |
| 8,341,492 B2 | | 12/2012 | Shen et al. | |
| 8,601,352 B1 | | 12/2013 | Anholt et al. | |

(Continued)

OTHER PUBLICATIONS

Kondoh et al., "A Study on Optimal BAR in Array Head Reading," IEEE Transactions on Magnetics, vol. 53, No. 11, Nov. 2017, 3 pgs. (abstract only).

(Continued)

*Primary Examiner* — Joseph D Torres
(74) *Attorney, Agent, or Firm* — PATENT LAW WORKS LLP

(57) ABSTRACT

Example channel circuits, data storage devices, and methods for using an extendable parity code matrix are described. A data unit may be read from a storage medium. Multiple sets of parity bits may be available for the data unit, each set of parity bits having a different number of parity bits corresponding to different parity matrices, including a primary parity matrix and at least one extended parity matrix. The extended parity matrix includes the primary parity matrix and additional rows for increased decoding. Error correction code (ECC) decoding may be selectively performed based on the different sets of parity bits and corresponding parity matrices, resulting in the output of a decoded data unit based on the data unit from the read signal.

21 Claims, 12 Drawing Sheets

(56) References Cited

U.S. PATENT DOCUMENTS

| | | | | |
|---|---|---|---|---|
| 8,677,205 | B2* | 3/2014 | Ramaraju | G06F 11/1064 |
| | | | | 714/755 |
| 9,059,737 | B2 | 6/2015 | Coker et al. | |
| 9,489,260 | B1* | 11/2016 | Hong | G06F 3/064 |
| 9,632,863 | B2 | 4/2017 | Galbraith et al. | |
| 9,881,643 | B1 | 1/2018 | Burton | |
| 10,437,674 | B1 | 10/2019 | Sridhara et al. | |
| 10,606,699 | B2 | 3/2020 | Oboukhov et al. | |
| 11,025,276 | B2 | 6/2021 | Richardson et al. | |
| 2004/0093549 | A1* | 5/2004 | Song | H04L 1/0041 |
| | | | | 714/752 |
| 2004/0199847 | A1* | 10/2004 | Calabro | H03M 13/2721 |
| | | | | 714/755 |
| 2007/0011566 | A1* | 1/2007 | Gray | H03M 13/1185 |
| | | | | 714/758 |
| 2009/0164864 | A1* | 6/2009 | Matsumoto | H03M 13/116 |
| | | | | 714/790 |
| 2010/0169736 | A1* | 7/2010 | Garani | H03M 13/1142 |
| | | | | 714/752 |
| 2014/0026018 | A1* | 1/2014 | Yang | G06F 11/1008 |
| | | | | 714/773 |
| 2014/0139942 | A1 | 5/2014 | Grobis et al. | |
| 2015/0128008 | A1 | 5/2015 | Chatradhi et al. | |
| 2020/0313696 | A1* | 10/2020 | Matuz | H03M 13/6544 |

OTHER PUBLICATIONS

Li et al., "Low-Density Parity-Check Codes With Run Length Limited (RLL) Constraints," IEEE Transactions on Magnetics, vol. 42, No. 2, Feb. 2006, pp. 344-349.

Matcha et al., "2-D LDPC Codes and Joint Detection and Decoding for Two-Dimensional Magnetic Recording," IEEE Transactions on Magnetics, vol. 54, No. 2, Feb. 2018, 11 pgs.

Mo et al., "Design and performance of LDPC codes extended with parity-check symbols from a larger alphabet," 2007 6th International Conference on Information, Communications & Signal Processing, Dec. 10-13, 2007, 3 pgs. (abstract only).

Suzutou et al., "Performance evaluation of LDPC coding and iterative decoding system in TDMR R/W channel with head skew," 2015 IEEE International Magnetics Conference (INTERMAG), May 11-15, 2015, 3 pgs. (abstract only).

Yang et al., "A Soft Decodable Concatenated LDPC Code," IEEE Transactions on Magnetics, vol. 15, No. 11, Nov. 2015, 3 pgs. (abstract only).

* cited by examiner

US 11,764,813 B1

EXTENDABLE PARITY CODE MATRIX CONSTRUCTION AND UTILIZATION IN A DATA STORAGE DEVICE

TECHNICAL FIELD

The present disclosure relates to read/write channel circuits for data storage devices. In particular, the present disclosure relates to extendable parity codes for varying code rates in error correction code (ECC) decode operations.

BACKGROUND

Data storage devices such as hard disk drives comprise a magnetic disk and a head connected to a distal end of an actuator arm which is rotated about a pivot by a voice coil motor (VCM) to position the head radially over the disk. The disk comprises a plurality of radially spaced tracks for recording user data sectors and servo sectors. In some configurations, referred to as concentric track, the radially spaced data tracks comprise concentric rings with starting and ending positions in the same ring, sometimes including one or more parity sectors at the end of the track. In some configurations, referred to as spiral track, the radially spaced data tracks comprise at least one continuous spiral comprising multiple data tracks and multiple revolutions of the disk, with track starting and ending positions at selected points along the spiral. The servo sectors comprise head positioning information (e.g., a track address) which is read by the head and processed by a servo control system to control the actuator arm as it seeks from track to track. The magnetic disk acts as a non-volatile storage medium for storing data.

FIG. 1 shows a prior art disk format 2 as comprising a number of servo tracks 4 defined by servo sectors 6_0-6_N recorded around the circumference of each servo track. In some configurations, each servo sector comprises a preamble for storing a periodic pattern, which allows proper gain adjustment and timing synchronization of the read signal, and a sync mark for storing a special pattern used to symbol synchronize to a servo data field. The servo data field stores coarse head positioning information, such as a servo track address, used to position the head over a target data track during a seek operation. Each servo sector 6, further comprises groups of servo bursts (e.g., N and Q servo bursts), which are recorded with a predetermined phase relative to one another and relative to the servo track centerlines. The phase-based servo bursts provide fine head position information used for centerline tracking while accessing a data track during write/read operations.

FIG. 2 shows a prior art mechanical configuration for a hard disk drive (HDD) 200 comprising a spindle 202 that holds a plurality of platters 204. Each platter 204 has at least one magnetic surface 206, such as a magnetic surface formatted similarly to disk format 2 in FIG. 1. Magnetic surface 206 may be configured to have digitally encoded data stored thereon as magnetized domains. A head 208 may be mounted at the end of an arm 210 controlled by an actuator 212. A read element 214 may be configured to detect magnetized portions of magnetic surface 206 and generate an analog read signal. A write element 216 may be configured to generate a timed write field to write (or erase) magnetized portions of magnetic surface 206 using an analog write signal. In some configurations, head 208 may include more than one read element 214 and/or write element 216 and HDD 200 may include multiple heads 208, arms 210, and/or actuators 212. In some configurations, head 208 may be referred to as a read head during read operations and a write head during write operations. A preamplifier (preamp or preamplifier circuit) 218 controls the read and write signals to the corresponding read and write elements (e.g., read element 214 and write element 216) of each head (e.g., head 208). Preamplifier 218 may be attached to a flex circuit 220 that provides a data and power bus connection to a printed circuit board (not shown) with other drive control circuitry, such as a disk drive controller, through a flex interface connector 222.

The disk drive controller may include a read/write channel configured to receive an analog read signal from read element 214 through preamplifier 218 and flex circuit 220. The channel may convert the analog read signal to a digital read signal and perform iterative data detection and decoding to recover the data previously stored to disk surface 206. In some configurations, the channel may be configured to perform data detection and decoding on a plurality of data sectors corresponding to a data track. For example, the track configuration may include a track skew (angular differences in track start positions) to allow a track read operation to complete based on maximum detection and postprocessing time.

The read/write channel may be configured with an error correction code (ECC) processor that decodes detected data bits (and/or likely data bit patterns from a soft information detector) based on an encoding and decoding scheme, such as low density parity check (LDPC) codes. For example, the ECC processor may process sets of detected or likely data bits through a decoding parity matrix to decode a target data unit. Some read/write channels rely on a fixed parity matrix configured in hardware or software for a desired code rate and corresponding number of parity bits for the data on the storage medium. The number of parity bits may be selected as part of the data configuration and data tracks stored on the disk may include parity sectors supporting the parity data bits (in a fixed number and position) for the data sectors on that track. It may be costly to include multiple parity matrices configured for different code rates in a read/write channel and prior disk formats may not support variable numbers of parity bits.

There is a need for technology that enables selective use of variable code rates and parity bit configurations.

SUMMARY

Various aspects for data storage devices with extendible parity code matrices are described, particularly read/write channels configured with a primary parity matrix and one or more extensions thereof that support multiple code rates and numbers of parity bits for different data units and/or regions on the storage medium.

One general aspect includes a channel circuit including an error correction code processor configured to: receive a read signal for a data unit; determine a second set of parity bits for the data unit, where the second set of parity bits has a second number of parity bits that is configured to be greater than a first number of parity bits of a first set of parity bits for the data unit; determine, based on the second set of parity bits, an extended parity matrix, where the extended parity matrix includes additional rows relative to a primary parity matrix based on the first set of parity bits; decode, based on the extended parity matrix, the data unit from the read signal; and output a decoded data unit based on the data unit from the read signal.

Implementations may include one or more of the following features. The channel circuit may include a parity selector configured to: select, from a plurality of numbers of parity bits, a selected number of parity bits corresponding to a desired code rate for a decode operation for the data unit; and determine, based on the selected number of parity bits and from a plurality of parity matrices, a parity matrix corresponding to the selected number of parity bits, where the plurality of parity matrices corresponds to a series of incremental extensions of the primary parity matrix based on incremental increases of the number of parity bits. The incremental increases in the number of parity bits may correspond to a predetermined increase in code rate and the plurality of parity matrices may include equivalent nodes from prior parity matrices in the series of incremental extensions. The plurality of parity matrices may include at least two incremental extensions in the series of incremental extensions of the primary parity matrix. A row weight of the primary parity matrix may equal a row weight of the extended parity matrix; a column weight of the extended parity matrix is greater than a column weight of the primary parity matrix; and additional nodes corresponding to the greater column weight of the extended parity matrix are distributed among additional rows in the extended parity matrix. The primary parity matrix may exclude 4-loops and 6-loops and the extended parity matrix may exclude 4-loops and 6-loops. The error correction code processor may be further configured to: determine the first set of parity bits; determine the primary parity matrix; and decode, using the primary parity matrix, the data unit, where determining the second set of parity bits, determining the extended parity matrix, and decoding based on the extended parity matrix are responsive to a failure to decode using the primary parity matrix. A data storage device may include the channel circuit and further include a storage medium comprised of a plurality of data tracks, where the read signal is configured to be generated from the plurality of tracks. The data storage device may further comprise a plurality of parity sectors stored on the storage medium, where the plurality of parity sectors includes parity bits for host data units in the plurality of data tracks and the data unit includes a parity sector of the plurality of parity sectors. The data storage device may include a first region of the storage medium and a second region of the storage medium, where the first region of the storage medium has a first bit error rate; data units in the first region have corresponding sets of parity bits of the first number of parity bits; the second region of the storage medium has a second bit error rate that is higher than the first bit error rate; and data units in the second region have corresponding sets of parity bits of the second number of parity bits. At least one configuration may be selected from: the first region is a first zone with a first bit density and the second region is a second zone with a second bit density; the first region is a first group of tracks within the first zone and the second region is a second group of tracks within the first zone; and the first region is a first data sector in a track in the first zone and the second region is a second data sector in the track in the first zone.

Another general aspect includes a method that includes: receiving a read signal for a data unit; determining a second set of parity bits for the data unit, where the second set of parity bits has a second number of parity bits that is configured to be greater than a first number of parity bits of a first set of parity bits for the data unit; determining, based on the second set of parity bits, an extended parity matrix, where the extended parity matrix includes additional rows relative to a primary parity matrix based on the first set of parity bits; decoding, based on the extended parity matrix, the data unit from the read signal; and outputting a decoded data unit based on the data unit from the read signal.

Implementations may include one or more of the following features. The method may include: selecting, from a plurality of numbers of parity bits, a selected number of parity bits corresponding to a desired code rate for a decode operation for the data unit; and determining, based on the selected number of parity bits and from a plurality of parity matrices, a parity matrix corresponding to the selected number of parity bits, where the plurality of parity matrices corresponds to a series of incremental extensions of the primary parity matrix based on incremental increases of the number of parity bits. The incremental increases in the number of parity bits may correspond to a predetermined increase in code rate; and the plurality of parity matrices may include equivalent nodes from prior parity matrices in the series of incremental extensions. The plurality of parity matrices may include at least two incremental extensions in the series of incremental extensions of the primary parity matrix. A row weight of the primary parity matrix may equal a row weight of the extended parity matrix; a column weight of the extended parity matrix may be greater than a column weight of the primary parity matrix; and additional nodes corresponding to the greater column weight of the extended parity matrix may be distributed among additional rows in the extended parity matrix. The primary parity matrix may exclude 4-loops and 6-loops; and the extended parity matrix may exclude 4-loops and 6-loops. The method may include: determining the first set of parity bits, determining the primary parity matrix, and decoding, using the primary parity matrix, the data unit, where determining the second set of parity bits, determining the extended parity matrix, and decoding based on the extended parity matrix are responsive to a failure to decode using the primary parity matrix. The method may include: storing, on a storage medium, a plurality of data tracks; storing, on the storage medium, a plurality of parity sectors corresponding to the plurality of data tracks, where the plurality of parity sectors includes parity bits for host data units in the plurality of data tracks and the data unit includes a parity sector of the plurality of parity sectors; and generating, from the storage medium, the read signal. The method may include storing, on a storage medium, a plurality of data tracks, where: a first region of a storage medium has a first bit error rate; data units in the first region have corresponding sets of parity bits of the first number of parity bits; a second region of the storage medium has a second bit error rate that is higher than the first bit error rate; and data units in the second region have corresponding sets of parity bits of the second number of parity bits.

Still another general aspect includes a data storage device that includes: a storage medium including a plurality of data tracks; means for receiving, from the storage medium, a read signal for a data unit; means for determining a second set of parity bits for the data unit, where the second set of parity bits has a second number of parity bits that is configured to be greater than a first number of parity bits of a first set of parity bits for the data unit; means for determining, based on the second set of parity bits, an extended parity matrix, where the extended parity matrix includes additional rows relative to a primary parity matrix based on the first set of parity bits; means for decoding, based on the extended parity matrix, the data unit from the read signal; and means for outputting a decoded data unit based on the data unit from the read signal.

The present disclosure describes various aspects of innovative technology capable of improving error rates by supporting multiple code rates and numbers of parity bits for different data units and/or regions on the storage medium.

The various embodiments include operations and control circuitry to overcome or at least reduce issues previously encountered in data storage devices and, accordingly, are more efficient, reliable, and/or higher performance than other data storage devices. That is, the various embodiments disclosed herein include hardware and/or software with functionality to improve data storage device performance, such as by using error correction codes and corresponding parity matrices that are extendable to support different code rates. Accordingly, the embodiments disclosed herein provide various improvements to data storage devices and computing systems incorporating such data storage devices.

BRIEF DESCRIPTION OF THE DRAWINGS

The techniques introduced herein are illustrated by way of example, and not by way of limitation, in the figures of the accompanying drawings in which like reference numerals are used to refer to similar elements.

DETAILED DESCRIPTION

Figure 1:
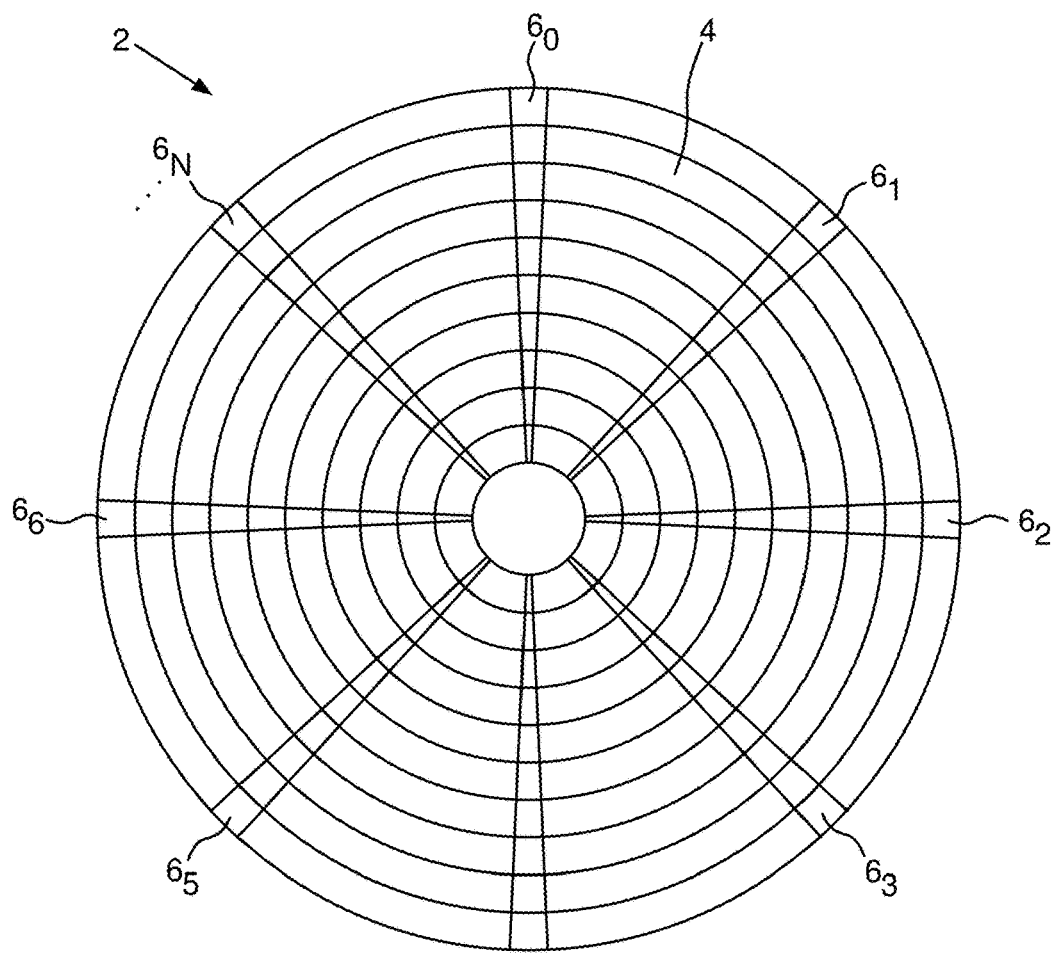
FIG. 1 is a diagram of a prior art disk format comprising a plurality of servo tracks defined by servo sectors.
Figure 2:
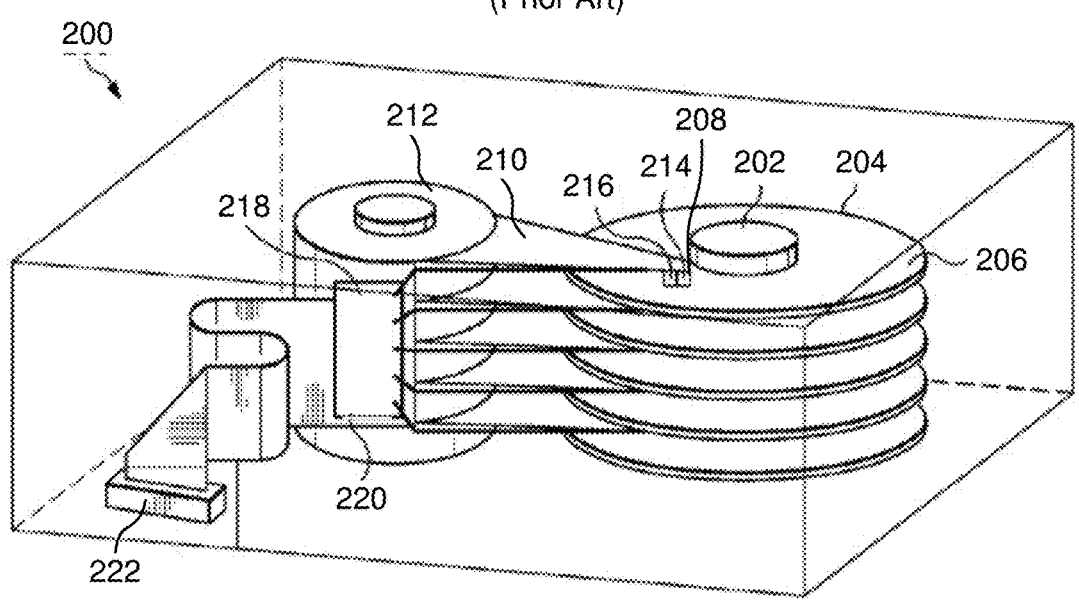
FIG. 2 is a diagram of an example data storage device in the form of a disk drive comprising a heads actuated over disk surfaces.
Figure 3:
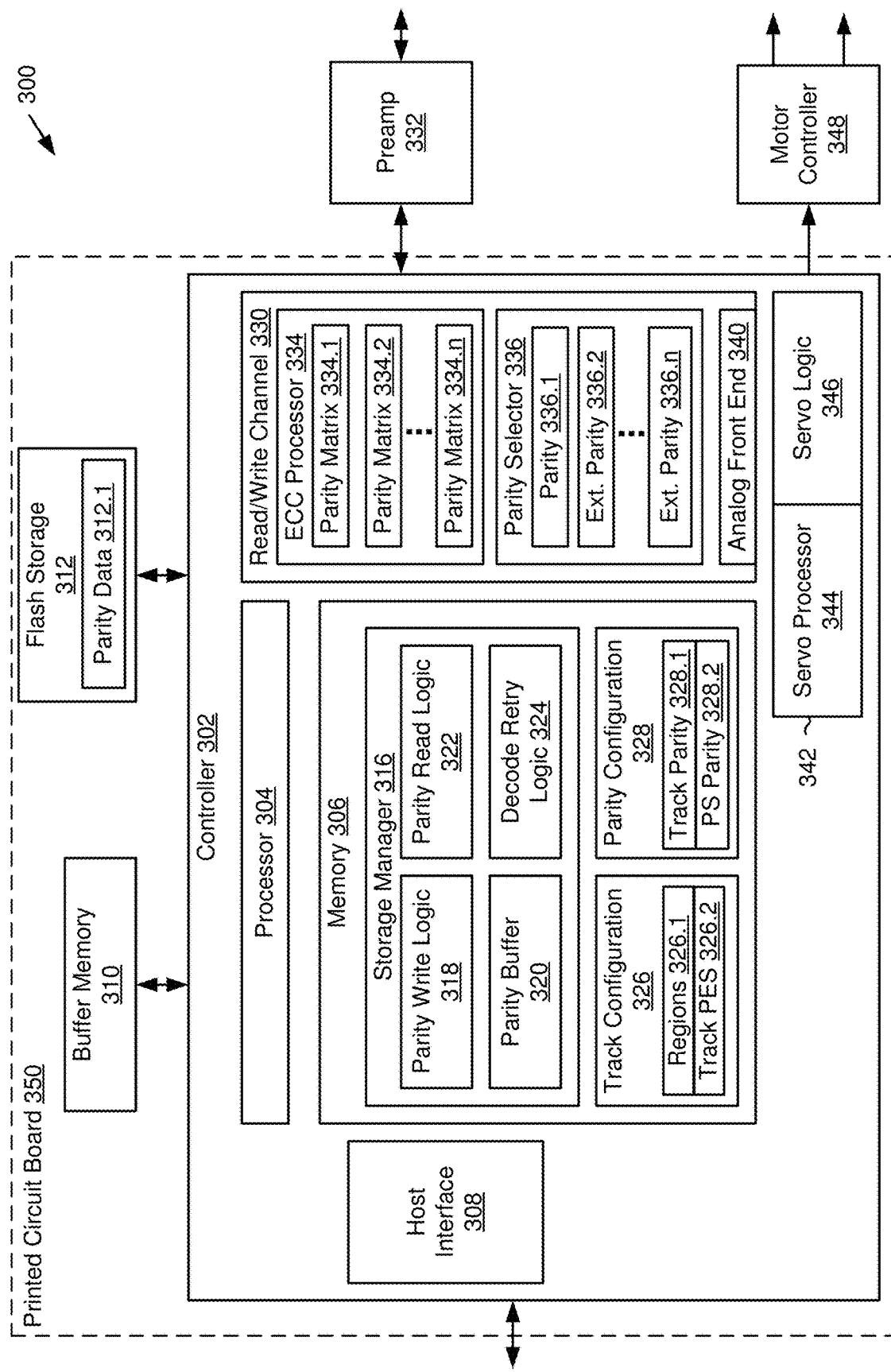
FIG. 3 is a block diagram of a configuration of data storage device electronics for a controller and read/write channel configured for extendable parity matrices.

FIG. 3 shows a portion of example control circuitry 300 for a data storage device, such as a hard disk drive (HDD). In the example shown, control circuitry 300 may include one or more controllers. Controller 302 may comprise a storage device controller configured to receive host storage commands, process storage operations for writing, reading, and managing data stored to non-volatile storage media in the disk drive, such as the magnetic media disks in FIGS. 1 and 2. In some embodiments, controller 302 may correspond to a separate host interface and read/write path to a subset of disk surfaces in a data storage device with multiple controllers. In some embodiments, controller 302 may be configured to manage servo and read/write operations for one or more actuators, heads, and corresponding writer and reader elements.

While for simplicity of description an HDD is used as the example data storage device, various embodiments are applicable to other forms of data storage devices such as solid state drives (SSD) comprising various forms for solid-state memory (such as NAND flash memory, NOR flash memory, magneto-resistive random access memory (MRAM), phase change memory (PCM), resistive random access memory (ReRAM)), tape drives, optical drives, etc. Those skilled in the art will recognize that the example references below to disk surfaces, sectors, tracks may be appropriately substituted with, or adapted to, corresponding physical or logical components or divisions within those forms of non-HDD data storage devices, and such description provided in this disclosure is not intended to limit the application of the described embodiments to HDD only.

Controller 302 may comprise a processor 304, a memory 306, a host interface 308, and access to a buffer memory 310 and/or flash storage 312. Controllers 302 may also comprise a read/write channel 330, and a servo controller 342 including a servo processor 344 and servo logic 346. In some embodiments, one or more of host interface 308, read/write channel 330, and servo controller 342 may be embodied in separate packages, such as application specific integrated circuits (ASICs), systems on a chip (SOCs), or other specialized circuits that interface with processor 304 and memory 306 for carrying out their respective functions. Controller 302 may include physical and electrical interfaces for connecting to buffer memory 310, flash storage 312, a power source (not shown), preamp 332, motor controller 348, other controllers, and/or other circuitry components. In some embodiments, the components of controller 302 may be interconnected by a bus that includes one or more conductors that permit communication among the components. For example, processor 304, memory 306, host interface 308, read/write channel 330, and/or servo controller 342 may be components attached to a printed circuit board assembly (PCBA) 350 that provides one or more layers of interconnect conductors among the components. Flash storage 312 may include one or more solid state memory packages, such as NAND memory, configured for non-volatile storage of data for storage and device management and/or hybrid storage features. For example, flash storage 312 may include an embedded solid state drive with its own storage controller and input/output (I/O) interface connected to controller 302. Flash storage 312 may be both physically and logically distinct from the primary non-volatile storage medium of the device, such as one or more disk surfaces, and/or memory 306.

Processor 304 may include any type of conventional processor or microprocessor that interprets and executes instructions. Memory 306 may include a random access memory (RAM) or another type of dynamic storage device that stores information and instructions for execution by processor 304 and/or a read only memory (ROM) or another type of static storage device that stores static information and instructions for use by processor 304 and/or any suitable storage element, such as a system portion of a hard disk media or a solid state storage element. Memory 306 may be configured to store controller firmware, comprising instructions that include one or more modules or sub-modules for specific data storage device operations and processor 304 may execute those instructions, including controlling communication with other components, such as host interface 308, buffer memory 310, read/write channel 330, and servo controller 342. Example modules in memory 306 may include a storage manager 316, a track configuration 326, and a parity configuration 328.

Storage manager 316 may be configured to receive host storage commands through host interface 308 and determine storage operations to be executed by controller 302 using read/write channel 330 and servo controller 342. For example, storage manager 316 may process read, write, delete, and similar commands targeting host data to be written to or read from the storage medium of the data storage device. Processing a read operation may include causing servo controller 342 to position the read heads over a desired track on the storage medium, applying a read voltage to the read head through preamp 332, receiving the read data in read/write channel 330, decoding the read data from the read head into decoded bit data returned to storage manager 316 (and/or buffer memory 310). Processing a write operation may include causing servo controller 342 to position the write heads over a desired track on the storage medium, applying a write voltage to the write head through preamp 332, and selectively changing the orientation of magnetic domains on the storage medium. Servo controller 342 may generate position error signals related to head positioning during both read and write operations.

Storage manager 316 may include parity write logic 318. For example, parity write logic 318 may assist storage manager 316 in determining and using parity configuration 328 to calculate and store parity data for each data unit written. Data units may include logical and physical sets of data bits written to and/or read from the storage medium and may be used to refer to tracks, sectors, blocks, and other data sets that receive corresponding parity encoding when stored to the storage medium. In some configuration, data units may refer to both host data units and parity data units, such as parity sectors appended to the end of a data track. Parity write logic 318 may calculate parity for data units as they are written and then store that parity, as a set of parity bits, to non-volatile memory for use during the decoding portion of read operations. For example, parity write logic 318 may calculate parity based on the target data unit, the encoding scheme, and a number of parity bits for that scheme. Parity write logic 318 may store the parity bits in one or more sets of parity bits and one or more corresponding parity storage locations, such as parity sectors at the end of each data track and/or extended parity locations after the parity sectors or in another location, such as flash storage 312. Note that extended parity may not be applied to all data units stored to the storage medium. For example, extended parity may only be applied to specific regions with higher bit error rates or track squeeze and/or to data units with special characteristics, such as parity sectors or other unmodulated data units and/or other data units designated as higher risk, Parity write logic 318 may include functions, methods, and/or data structures for determining and storing both primary or base parity bits and one or more extended sets of parity bits. For example, parity write logic 318 may calculate parity from the data unit for a primary set of parity bits that includes a first portion of the total parity bits that corresponds to a minimum number of parity bits for the data unit and the primary parity matrix used for decoding operations. Parity write logic 318 may also calculate at least one extended set of parity bits from the data unit that include additional parity bits to provide an increased code rate corresponding to an extended parity matrix. In some configurations, parity write logic 318 may calculate additional parity bits for an incremental series of extended sets of parity bits corresponding to incremental increases in code rate and improved decoding capabilities. For example, parity write logic 318 may calculate 32 parity bits for the data unit, where the first 28 parity bits are the primary parity bits, the next two parity bits (to position 30) are a first extended set of parity bits, and the last two parity bits (to position 32) are a second extended set of parity bits. Any number of extensions may be possible, including extensions greater than two, such as seven or more extensions. Each extension in the sequential series may correspond to an incremental increase in code rate, such as a 0.7% increase in code rate for each extension. These variable code rates may be configured to cover a range of code rates corresponding to different media regions, read/write characteristics, formatting, modulation, or other characteristics that can impact the base bit error rate and/or decoding capabilities of the read/write channel.

In some configurations, parity write logic 318 may calculate a maximum number of parity bits corresponding to a maximum code rate and largest parity matrix in read/write channel 330. For example, this maximum set of parity bits may be calculated and stored for each data unit receiving the extended parity protection. This may provide the maximum options for read operation recovery of the data unit. In some configurations, one or more extended sets of parity bits may be calculated and stored that are less than the maximum number, such as designating different bands with different code rates. In some configurations, the maximum number of parity bits may be calculated and stored temporarily, such as in parity buffer 320, and then discarded once parity write logic 318 determines a desired code rate and the number of parity bits needed for that code rate. For example, a data unit, such as a track or sector, may be written and the quality of the data unit as written may be determined. In shingled magnetic recording (SMR), the quality metric may be track squeeze and can be determined from the servo position error signal (PES) generated during the write operation. For example, a desired code rate table or similar reference data structure may be accessed by parity write logic 318 to map different levels of PES to desired code rates (and corresponding numbers of parity bits) for compensating for track squeeze. In systems with read verification of writes, a bit error rate may be determined upon readback (e.g., using the primary parity bits) and a desired code rate table may be map code rates to bit error rate. Other write or readback quality metrics may be used for selecting the desired code rate and number of parity bits. Once the desired code rate and number of parity bits are determined, that number of parity bits may be committed to non-volatile memory, such as being written to the target track, an adjacent track, another parity storage location on the storage medium, or a different parity storage location, such as flash storage 312. Parity write logic 318 may write the maximum parity for one or more write operations to parity buffer 320 and maintain it until the desired parity is written to a non-volatile parity storage location associated with the data unit and accessible to the read channel. Once the desired number of parity bits are committed for the data unit, the temporary storage in parity buffer 320 for that data unit may be erased or overwritten, such as in a circular buffer configuration with a fixed number of slots corresponding to the maximum number of parity bits.

Storage manager 316 may include parity read logic 322. For example, parity read logic 322 may assist storage manager 316 and read/write channel 330 to access extended sets of parity bits for read operations. In some configurations, each data unit supported by extended parity may have at least two sets of corresponding parity bits, such as a set of primary parity bits and one or more extensions, and those parity bits may or may not be stored on the storage medium with the data unit. For example, extended parity bits for one or more sectors may be stored continuously with the parity sectors at the end of the track, may be stored in an alternate location, such as following the parity sectors of the next track, or may be stored in a separate storage medium, such as flash storage 312. Read parity logic 322 may be configured to use a variety of decoding and retry schemes leveraging extended parity. For example, read parity logic may use the primary parity bits as the default for decode operations to conserve processing resources and manage channel throughput or may use the highest extended set of parity bits available for the data unit to maximize the likelihood of successfully decoding the data unit on the first pass. Where the first pass at decoding a target data unit is not the highest extended set of parity bits available, parity read logic 324 may invoke decode retry logic 324 for additional decode operations using incrementally higher sets of parity bits and corresponding code rates. Parity retry logic 322 may assist read/write channel 330 in selecting the number of parity bits to be used for a given decode operation and determining the parity storage location based on parity configuration 328. In some configurations, determining the available extended parity for a target data unit may be based on track configuration 326 and the parity storage location (or locations) for the extended parity may be based on parity configuration 328.

Parity read logic 322 may include functions, methods, and/or data structures for determining and accessing both primary parity bits and one or more extended sets of parity bits for a target data unit. In some configurations, extended parity may be stored in one or more extended parity sectors at the end of the data track and/or parity sectors to which it applies. For example, track configuration 326 may include a formatting allowance for extended parity adjacent the parity sectors to improve the reliability of the parity sectors for the host data, which may lack modulation codes and, therefore, have less reliable data recovery than the host data sectors with modulation codes. Similarly, extended parity may be included in a per track formatting allowance and selectively applied to the parity for individual sectors that have higher bit error rates, such as due to localized media defects or areas with poorer magnetic material and performance (such as the clamping regions near the outer diameter of the disk). Formatting allowances to enable per track storage of extended parity for all data units may result in decreased format efficiency. If the storage area required for extended parity exceeds an amount that is acceptable on the storage medium, alternate parity storage locations may be used, such as other non-volatile storage available in the storage device (e.g., flash storage 312).

In some configurations, parity read logic 322 may use track configuration 326 to determine what extended parity is available for different data units on the storage medium. Track configuration 326 may be based on how the storage medium has been configured for data storage. Track configuration 326 may include a combination of servo formatting (see FIG. 1) and data track formatting. Track configuration 326 may support a defined block size and corresponding number and size of sectors per track. Track configuration 326 may also include defined parity sectors providing parity for the sector data along that track. In some embodiments, track configuration 326 may include data track formatting as either concentric tracks, where each track form a distinct ring with a starting and ending point on the same circumference, or continuous tracks, where the tracks form a continuous spiral with start and end positions that are not on the same circumference. Track configuration 326 may be stored in a set of media configuration parameters for the servo and data track formats. In some configurations, track configuration 326 may identify different regions 326.1 of the storage medium with different storage characteristics. For example, regions 326.1 may divide the storage medium into radial sectors (wedges of data between servo sectors) and circumferential bands (groups of adjacent tracks).

Track configuration 326 may store information regarding media regions with inferior storage characteristics corresponding to higher bit error rates for data stored to those regions. These higher bit error rate regions may be designated to receive extended parity for host data and/or parity data stored to those regions and this may be indicated in track configuration 326. In some configurations, the variable code rates provided by extended parity may be directly mapped to regions 326.1. For example, sequential increments of extended parity may be mapped to a plurality of bands so that different code rates may be used for data tracks closer to the inner diameter (ID) versus those closer to the outer diameter (OD). Bit density of tracks may be configured to vary from zone-to-zone and/or track-to-track. In some configurations, the different code rates may be achieved between adjacent zones, tracks, and/or sectors with a consistent bit density using extended parity. In SMR data storage devices, track squeeze may be quantified using track PES 326.2. One or more levels of track squeeze may be determined and stored in track configuration 326 and corresponding logic for mapping track PES 326.2 to different parity extensions for desired code rates may be used by parity write logic 318 to stores a desired amount of extended parity and parity read logic 322 to determine the availability of that extended parity.

In some configurations, parity read logic 322 may use parity configuration 328 to determine the location of primary parity and/or extended parity for a target data unit. For example, parity configuration 328 may include a data structure mapping track and/or region identifiers based on track configuration 326 to parity storage locations. In some configurations, a relatively simple configuration of extended parity on the storage medium may be configured in the formatting of track configuration 326 and a separate parity configuration data structure may be unnecessary. For example, extended parity for parity sectors that is appended to those parity sectors in the allocated track format may not use a separate parity configuration. In some configurations, a more complex parity configuration, particularly where variable amounts of extended parity are stored for different data units, parity configuration 328 may provide logic and/or a reference data structure for determine where the primary parity bits and/or extended parity bits for a data unit are located. For example, variable amounts of extended parity for higher bit error rate regions and/or compensating for track squeeze in SMR storage devices may be managed through a separate mapping table based on track and/or region identifiers. In some configurations, data track and/or sector parity 328.1 may be mapped for providing extended parity for host data and parity sector parity 328.2 (the parity bits that apply to decoding the parity sector data itself) may be mapped for protecting the integrity of the parity data used for decoding the host data. In some configurations, some or all of primary parity data and/or extended parity data may be stored in an alternate location from the storage medium storing the data tracks. For example, one or more sets of extended parity bits may be stored in flash storage 312 as parity data 312.1. Parity configuration 328 may include an index of parity data 312.1 for locating and accessing the offloaded parity data when needed by read/write channel 330. For example, parity data 312.1 may include extended parity data indexed by track and/or region identifier and parity configuration 328 may provide the lookup table used by parity read logic 322 to access the extended parity data.

Storage manager 316 may include decode retry logic 324. For example, decode retry logic 324 may assist storage manager 316 and read/write channel 330 in managing retries and other data recovery schemes when a data unit cannot be successfully decoded by read/write channel 330. When read/write channel 330's iterative detection and decoding process cannot successfully decode a target data unit, one or more recovery processes may be triggered, including retry attempts managed by decode retry logic 324. Decode retry logic 324 may include functions, methods, and/or data structures that leverage extended parity bits and corresponding increased code rates for subsequent attempts to decode and/or re-read the data unit. For example, an initial pass at decoding the data unit may use the primary set of parity bits or an initial set of extended parity bits and, responsive to a decode failure, decode retry logic 324 may determine that extended parity bits providing a higher code rate are available for the data unit. Decode retry logic 324 may initiate a decode retry and/or read retry using extended parity bits with a higher code rate. Decode retry logic 324 may use parity read logic 322 to determine and access the extended parity bits. In some configurations, decode retry logic 324 may determine that there is a plurality of sets of extended parity bits corresponding to incremental increases in code rate and decode retry logic 324 may iteratively attempt decode retries using each incremental increase in code rate until the data unit is successfully decoded or the maximum available code rate has been attempted. Failure of the maximum extended parity and code rate may trigger a read error and/or one or more heroic recovery modes. In some configurations, one or more decode retries may be based on read data previously buffered for an earlier decode attempt. In some configurations, one or more decode retries may be based on a re-read operations where the read head rereads the target data unit from the storage medium. Decode retry logic 324 include or access interfaces for controlling read-write channel 330 and/or servo controller 342 to execute decode and/or re-read retries.

Host interface 308 may include any transceiver-like mechanism that enables the data storage device to communicate with other devices and/or systems, such as a host system for which the storage device provides data storage. Host interface 308 may comprise a host storage interface compliant with one or more storage interface standards, such as a Serial Advanced Technology Attachment (SATA) interface, a Small Computer System Interface (SCSI), serial attached SCSI (SAS), peripheral computer interface express (PCIe) (e.g., Non-Volatile Memory Express (NVMe)), etc., for connecting host interface 308 to peripheral interface or network port.

Buffer memory 310 may include a RAM, flash, or another type of dynamic storage device for storing host data and other information in transit between the storage media of the storage device and the host (via host interface 308). In some embodiments, buffer memory 310 is a separate memory device from memory 306 and the disk surfaces or other non-volatile memory of the data storage device.

Read/write channel 330 may include one or more specialized circuits configured for processing binary data to be written to the disk surfaces using an analog write signal and processing the analog read signal from the disk surfaces back into binary data. For example, read/write channel 330 may include a write path comprised of various data scramblers, run-length limited (RLL) encoders, iterative error correction code (ECC) encoders, precompensation circuits, and other data or signal processing components. Read/write channel 330 may include a read path comprised of various amplifiers, filters, equalizers, analog-to-digital converters (ADCs), soft information detectors, iterative ECC decoders, and other data or signal processing components. The write channel components may comprise a write channel circuit and the read channel components may comprise a read channel circuit, though the circuits may share some components. Read/write channel 330 may provide the analog write signal to and receive the analog read signal from preamp 332, which controls and amplifies signals to and from the heads. Binary data for recording to the storage medium may be received by read/write channel 330 from storage manager 316 and decoded data from read/write channel 330 may be passed to storage manager 316 and/or directed to buffer memory 310 for communication to the host. In some embodiments, read/write channel 330 may include an analog front end 340 configured to receive the analog read signal from preamp 332 and convert it into a digital read signal for processing by other components of read/write channel 330. For example, analog front end 340 may include an analog-digital converter (ADC), timing circuit, and one or more filters, equalizers, and/or other signal conditioning components for generating the digital read data.

In some configurations, read write channel 330 may include an ECC processor 334 configured to receive read data for a data track from the read heads and use iterative ECC processing to decode the received read data into decoded data for further processing by storage manager 316 and/or communication to the host. For example, ECC processor 334 may include one or more soft output Viterbi algorithm (SOVA) detectors and low density parity check (LDPC) decoders operating on multi-bit encoded symbols to decode each sector of data received by read/write channel 330. Iterative decoding may be based on soft information, such as log-likelihood ratios (LLR), generated from SOVA detectors and/or LDPC decoders. In some configurations, ECC processor 334 may include logic for parity sector decoding that uses parity stored in sectors at the end of a data track to provide additional soft information for decoding the original codewords (and/or extended parity) read for each data sector. In some configurations, ECC processor 334 may include logic for soft track ECC to generate soft information for the data sectors in the track in addition to the LDPC soft information generated for each codeword.

ECC processor 334 may include a parity matrix to support decoding operations, such as an H-matrix for the LDPC code used to decode a target data unit, that is populated and executed using the target data unit and a corresponding set of parity data. ECC processor 334 may support a plurality of parity matrices and, more specifically, an extendable set of parity matrices where each parity matrix is an extension of the prior parity matrix that includes the nodes of that prior parity matrix. For example, the plurality of parity matrices may include a primary parity matrix 334.1 and any number of extensions to that parity matrix, such as extended parity matrix 334.2 and extended parity matrix 334.$n$. ECC processor 334 may use any one of the parity matrices based on the parity bits available for the decode operation. For example, some data units may be decoded using primary parity matrix 334.1 and other data units may be decoded using extended parity matrix 334.2 or extended parity matrix 334.$n$. As described above, different decode attempts may use different sets of parity bits and corresponding parity matrices. Each of the plurality of parity matrices may correspond to a different code rate with increasing decoding capabilities. ECC processor 334 may operate on a data unit stored in a buffer memory of read/write channel 330. In some configurations, ECC processor 334 may perform multiple sequential decode operations (using extended parity bits and matrices) on the data unit stored in the channel data buffer without an intervening read operation from the storage medium. ECC processor 334 may receive one or more sets of parity bits for a data unit from parity selector 336.

Read/write channel 330 may include a parity selector 336 for managing multiple sets of parity bits for the same data unit. For example, a data unit configured with extended parity may include a set of primary parity bits 336.1 and one or more sets of extended parity bits, such as extended parity bits 336.2 and 336.n. Parity selector 336 may provide a selected set of parity bits for a particular decode operation by ECC processor 334. For example, parity selector 336 may store a set of parity bits to a parity buffer or register for use by ECC processor 334. The number of parity bits in the selected set of parity bits for the operation may be used by ECC processor 334 to determine the corresponding parity matrix to be used for the decode operation. In some configurations, parity selector 336 may determine only one set of parity bits for a data unit at a time, based on parity read logic 322, and provide that set of parity bits to ECC processor 334 for the decode operation. In some configurations, parity selector may receive the maximum available set of parity bits for the data unit, store them to a parity buffer in read/write channel 330, and selectively indicate to ECC processor 334 the number of parity bits (and corresponding parity matrix) to be used for that decode operation.

Servo controller 342 may include one or more specialized circuits configured to process servo data, such as position error signals, from the disk surfaces and providing a control signal to position the actuators in a closed-loop control system. Servo controller 342 may also receive commands from processor 304 for positioning operations, such as seek, track follow, load, unload, sweep, idle, and other actuator positioning operations. Servo controller 342 may also implement servo error recovery processes for recovering from servo errors. In some embodiments, servo controller 342 may include servo processor 344 and servo logic 346 (stored in a servo memory). For example, servo processor 344 may be a dedicated processor circuit and servo logic 346 may be firmware stored in RAM associated with the dedicated processor to provide dedicated computing resources for managing the servo functions. Servo controller 342 may receive servo signals read from the disk surface using preamp 332 and provided to servo controller 342. Servo controller 342 may provide servo control signals to motor controller 348 and motor controller 348 may control one or more actuator VCMs and/or a spindle motor for rotating the disk stack.

Figure 4A:
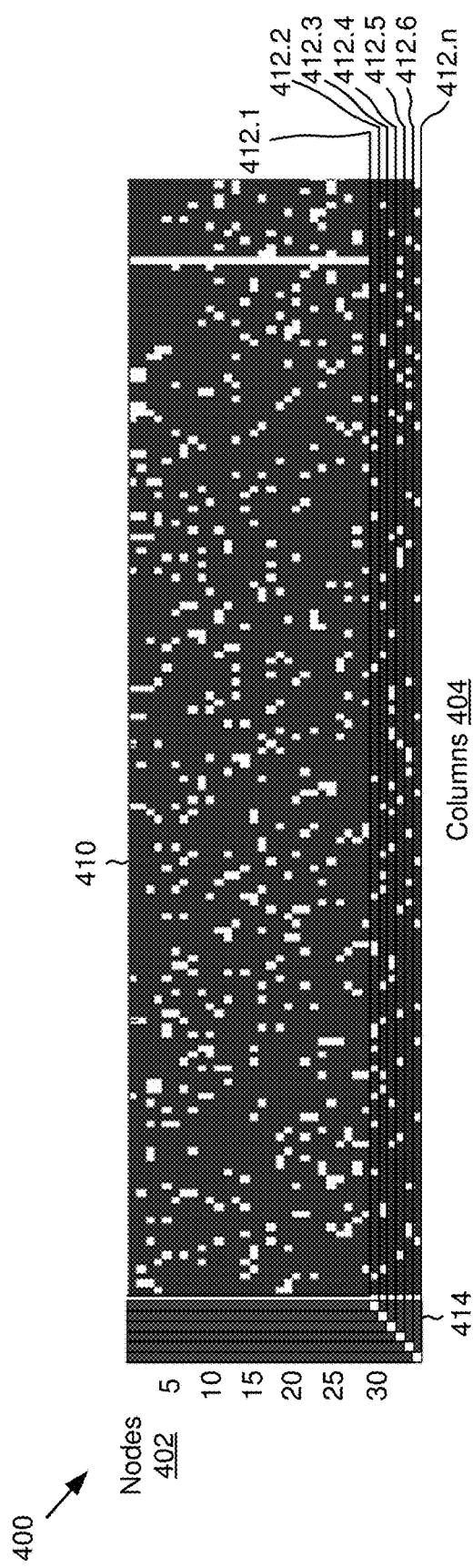
FIGS. 4A and 4B are diagrams of example extendable parity matrices.
Figure 4B:
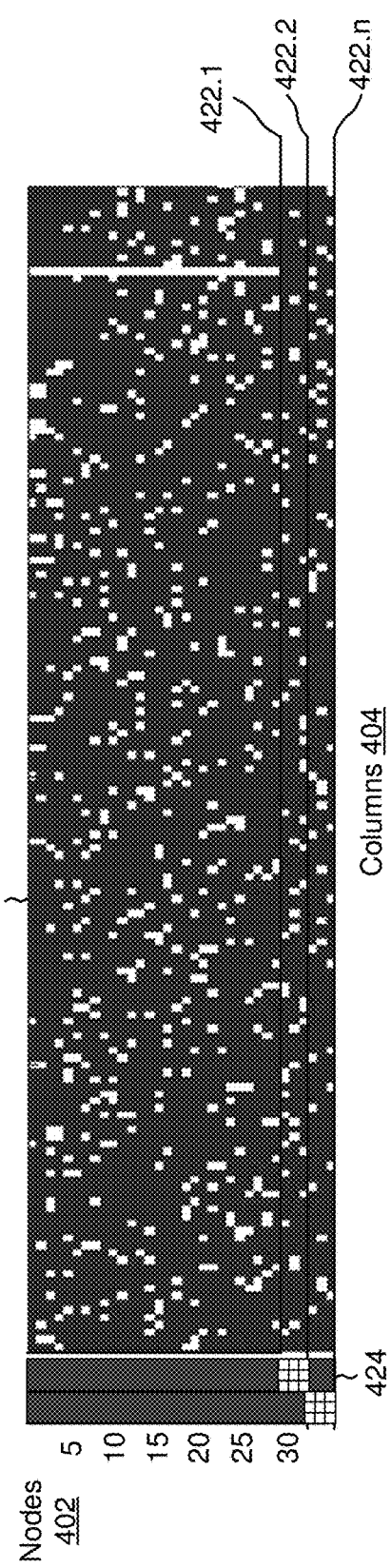

FIGS. 4A and 4B show an example node distribution 410 for an extended parity matrix 400 that may be used in conjunction with control circuitry 300 in FIG. 3 and/or the methods of FIGS. 9-13. Typically, the structure of an LDPC H-matrix is shown as set of nodes. Light squares represent a 1-node, black squares represent a 0-node. To scale up nodes of an H-matrix by n-times to an actual bit H-matrix of the desired sector size, each node is replaced by an identity matrix n×n for 1-nodes and a zero n×n matrix for 0-nodes. Similar scaling could be achieved by using permutation matrices instead of identity. This may help to develop optimal search procedure to eliminate 4- and 6-cyles from the final bit H-matrix.

FIG. 4A shows primary node H-matrix 410 which is extended by additional rows from line 412.1 to line 412.n. Parity nodes 402 are shown on the left. They have column weight 1. This construction may be used when additional parity bits are stored in flash storage and is protected there by separate ECC. In this construction, very fine extension steps equal to a single node may be achieved. For example, each line from 412.1 to 412.n is a cumulative extension of one parity node corresponding to extended parity bits 414.

FIG. 4B shows a primary node H-matrix 420 that is also extended by additional rows from line 422.1 to line 422.2 to line 422.n. In this case, extended parity bits 424 are grouped in 3×3 node clusters. This construction allows for storing additional parity using less space, such as on the same disk, with strong protection defined by column weight 3 for each parity bit. In this case the step in H-matrix extension will be larger, in comparison with case in FIG. 4A.

While example numbers of extensions are shown in FIGS. 4A and 4B, any number of extended parity matrices could be configured in this way, where each sequential expansion of the parity matrix includes the prior parity matrix. This configuration may allow overlapping circuitry and/or firmware to be used for the series of parity matrices. Each extended parity matrix incrementally increases the code rate relative to the prior parity matrix. In some configurations, this increase in code rate may be linear and/or configured to equal a predetermined step in code rate. In some configurations, extended parity matrix 400 may be configured for a population of storage devices based on a set of LDPC codes that define the number of parity bits used for each matrix, the size of the data unit being decoded, and the distribution of nodes for executing that matrix.

Construction of "good" extended LDPC H-matrices may start from a primary node matrix. For this primary parity matrix, the minimal column weight may be defined and searched for the absence of 4- and 6-cycles until this condition is fulfilled. After the primary node matrix is determined, desired extensions of the primary node matrix may be determined, keeping row weight constant. Additional nodes in the extended area will increase the column wight for the extended H-matrix. In some configurations, the increase in column weight may be distributed as uniformly as possible across the extensions, increasing the column weight incrementally. The column weight of the first extended parity matrix is greater than the column weight of the primary parity matrix and the column weight of the second extended parity matrix is greater than the column weights of the first extended parity matrix and the primary parity matrix. The extended H-matrix for one or more parity matrix extensions may also be searched to eliminate 4- and 6-cycles. Therefore, any extension of H-matrix from 'basic' size to any extended size will be a 'good' LDPC matrix with reasonable column weight and absence of 4- and 6-cycles.

Figure 5:
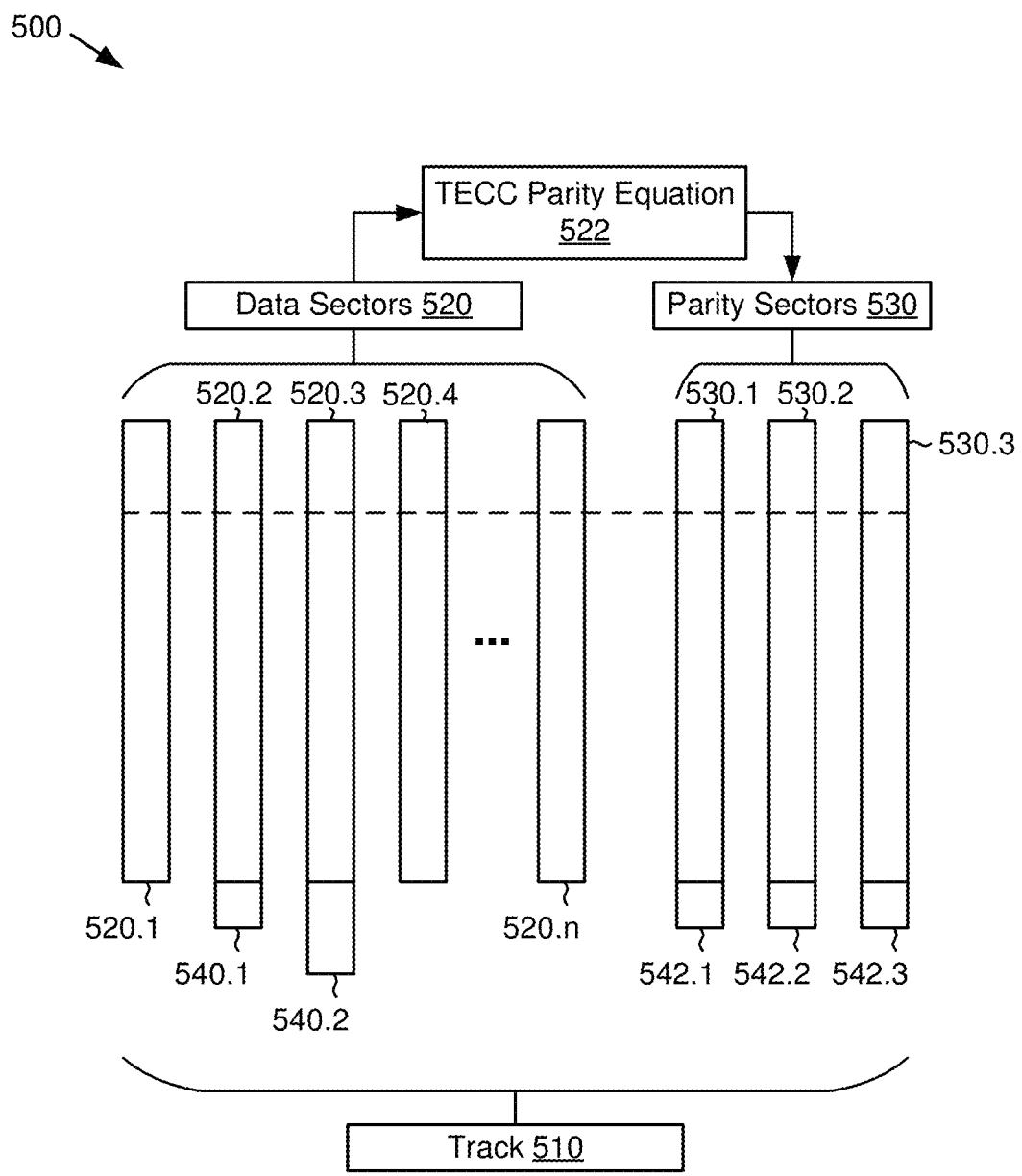
FIG. 5 is a diagram of example extended parity for a data track.

FIG. 5 shows an example of how extended parity data may be integrated with track ECC code. In some configurations, these two features may be closely integrated to provide enhanced ECC protection and decoding capabilities. FIG. 5 shows a track 510 composed of data sectors 520 (codewords) and parity sectors 530. Each of these data sectors 520.1-520.n may have extended parity. For example, data sector 520.2 may have extended parity 540.1 and data sector 520.3 may have extended parity 520.3. Not all data sectors may include extended parity and those with extended parity may have different numbers of extended parity bits.

For example, as described elsewhere, extended parity may be selectively generated for data sectors that have higher bit error rates. Parity sectors 530 may be computed on basic (shortest) codeword for data sectors 520 and may represent valid LDPC codewords, since it is a linear operation. After computation of basic parity sectors 530.1-530.3, each parity sector may be extended by their own extended parity 542.1-542.3 to enforce decoding. In some configurations, it may be desirable to compensate for the absence of modulation codes in parity sectors 530 by adding extend parity 542. Decoding of such tracks will be very similar to conventional decoding and may not require significant additional processing resources or timing. First, all data sectors 520 may be attempted using LDPC (extended or not) decoding. Failed data sectors may be collected in a sector buffer and soft information, such as log-likelihood ratios (LLR), updated using parity sectors 530. Only a basic part of the codeword is updated based on track ECC (TECC) parity equation 522. Then, each buffered data sector is tried again using LDPC (extended or not) decoding, and so on.

Figure 6:
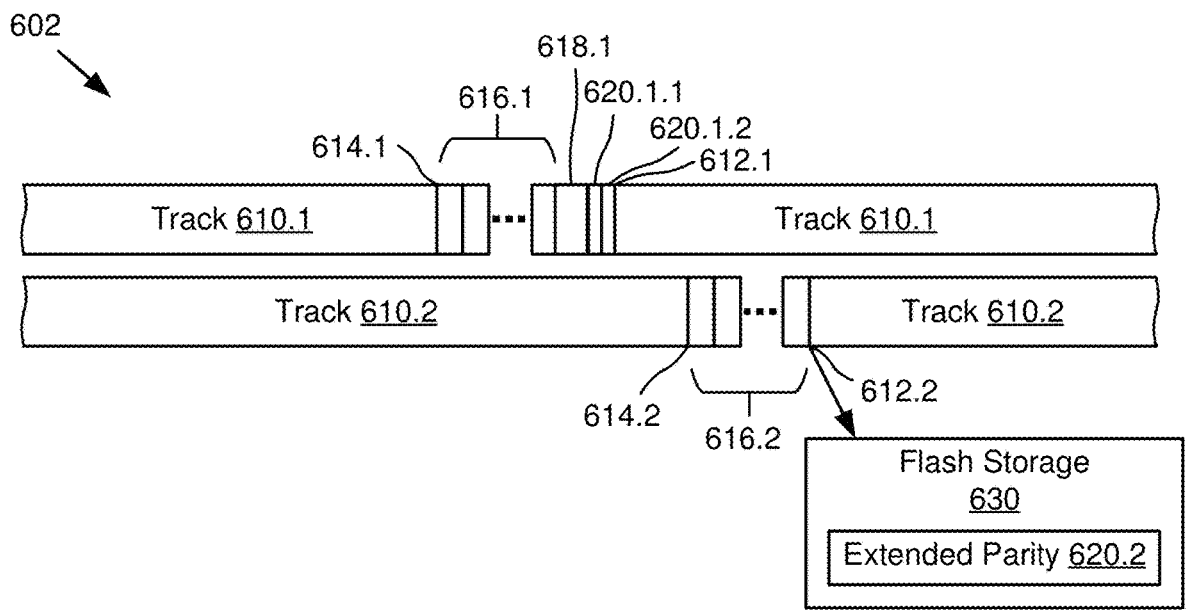
FIG. 6 is a diagram of an example disk format with extended parity data.

FIG. 6 shows an example disk format with extended parity data 620 for tracks 610.1 and 610.2. Each track 610 forms a concentric ring at a determined circumference. The curvature is not reflected due to the large difference between track width and circumference and only the segment near the start and end of each track is shown (not the entire track). Track 610.1 has a track start 612.1 and a track end 614.1 and traverses a plurality of sectors in between. The data sectors would include a first data sector proximate track start 612.1 and a last data sector proximate track end 614.1. Track 610.1 also includes a set of parity sectors 616.1 including additional ECC parity data for the data sectors in track 410.1. In some configurations, parity sectors 616.1 may not include a modulated code. Track 610.1 includes a set of extended parity sectors 620.1.1 and 620.1.2. For example, extended parity sector 620.1.1 may include extended parity data for parity sectors 616.1 to enable a higher code rate to be used for compensating for their lack of modulated code. As another example, extended parity sector 620.1.2 may include extended parity for a particular data sector of track 610.1 with a higher bit error rate, such as a sector containing a media defect or region with inferior magnetic characteristics (such as the clamping shadow near the OD of the disk).

Track 610.2 is configured similarly to track 610.1, including a track start 612.2, a track end 614.2, a plurality of data sectors (not shown), and a set of parity sectors 616.2. However, this track's format does not include space for storing extended parity on the storage medium. Extended parity 620.2 may instead be stored in flash storage 630 in the data storage device for use during read operations. For example, extended parity 620.2 may include extended parity for one or more data sectors in track 610.2 corresponding to regions with different desired code rates and/or extended parity for parity sectors 616.2.

Figure 7:
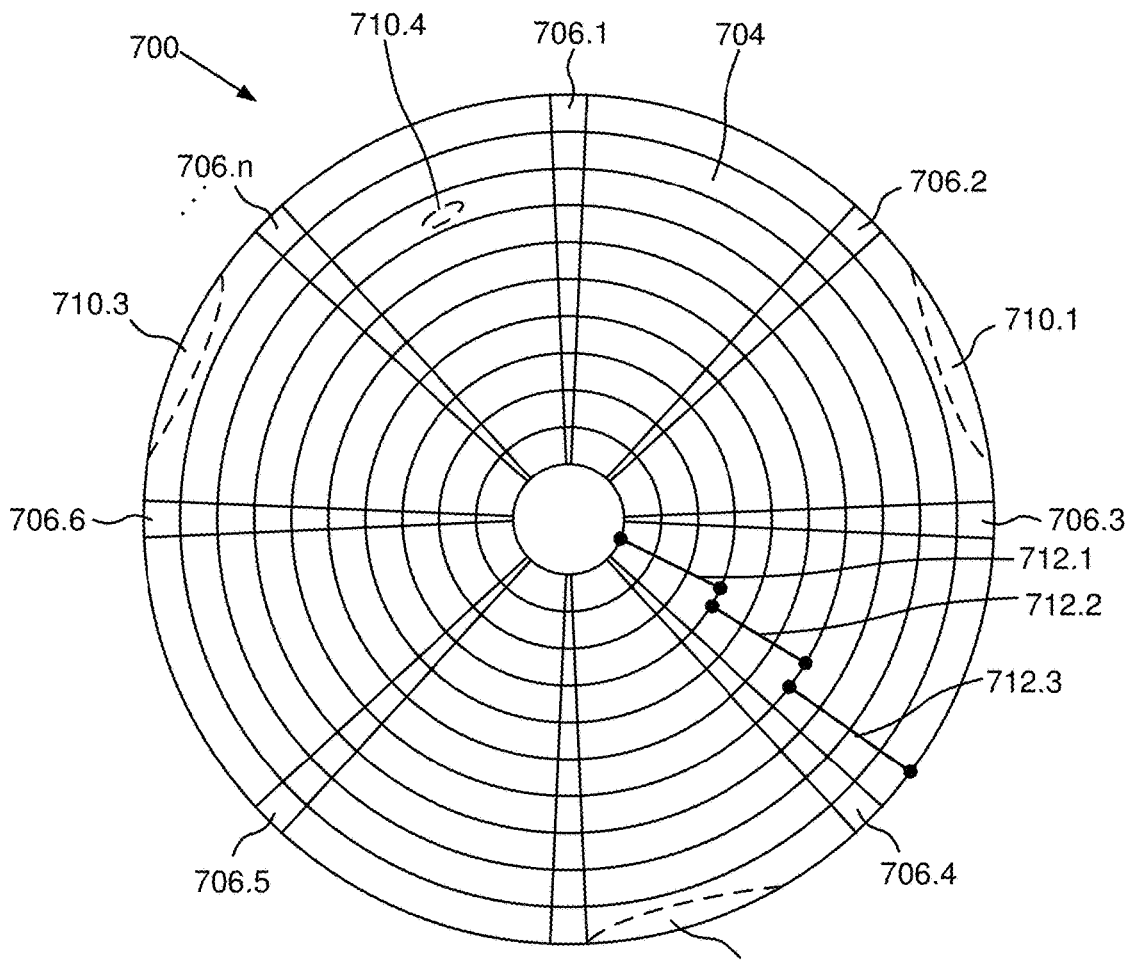
FIG. 7 is a diagram of an example disk format with varying regions and desired code rates.

FIG. 7 shows an example disk format 700 with varying regions and desired code rates. Disk format 700 comprises a number of data tracks 704 defined by servo sectors 706.1-706.*n* recorded around the circumference of each track. Servo sectors 706 may be formatted similarly to those described for FIG. 1 and used for navigating data tracks 704 using a servo controller. Disk format 700 may divide the surface of the disk into a plurality of data tracks 704 comprised of data sectors between the respective servo sectors. In some configurations, data units managed by the storage device may include tracks and/or sectors within those tracks, as well as parity sectors (as described with regard to FIG. 6) corresponding to those tracks and sectors.

A data storage device supporting extended parity may apply extended parity on a data unit and/or region basis, including sectors, tracks, and/or bands (groups of multiple adjacent tracks).

FIG. 7 demonstrates several use cases for extended parity and corresponding increased code rates for different regions. For example, one or more regions or data units may correspond to areas of the disk surface with poor data quality, which may be represented by higher (uncorrected) bit error rates. For example, clamp shadow regions 710.1, 710.2, and 710.3 may include areas of the disk surface adjacent the OD that have worse magnetic characteristics than most of the surface of the disk. In some configurations, regions and/or data units corresponding to regions 710.1, 710.2, and 710.3 may be written with extended parity to enable higher code rates for reading data from those regions. As another example, media defects may be identified elsewhere on the disk surface, such as media defect 710.4, and the data unit or data units written to the region of media defect 710.4 may be written with extended parity.

In some configurations, disk format 700 may define a plurality of bands, such as bands 712.1-712.3, that correspond to adjacent groups of tracks. These bands may be defined from the ID to the OD. Due to the varying track lengths based on the varying circumferences of tracks as one moves from the ID to the OD, the size and spacing of magnetic domains for storing bit data may be different. As a result, different bands of tracks may benefit from different code rates. Another example use case is assigning extended parity to sequential bands of tracks to increase the code rate to compensate for variations in the bit error rate based on track distance from ID. For example, sequential bands of tracks may be defined as regions having an average bit error rate and a series of parity extensions may incrementally increase the code rate in each sequential band to compensate for variations in average bit error rate. Data tracks within each band would receive the corresponding extended parity during write operations based on the band to which the track is assigned. While FIG. 7 shows three bands, which would likely correlate to a primary parity set and two extended parity sets, the number of bands and corresponding desired code rates and number of parity bits may be configured for any number that provides useful ranges for customizing the code rates used at different circumferences.

Figure 8:
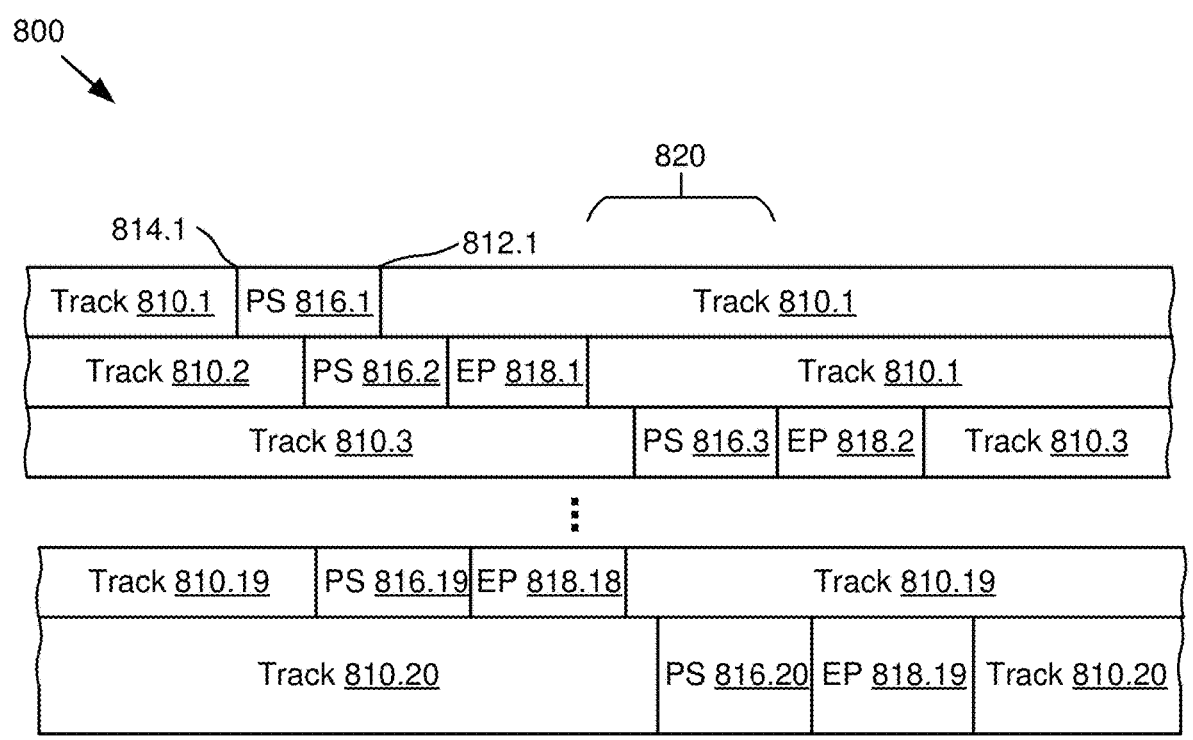
FIG. 8 is a diagram of an example disk format using extended parity data for shingled magnetic recording.

FIG. 8 shows an example disk format 800 using extended parity data for shingled magnetic recording (SMR). More specifically, an example band of tracks 810.1-810.20 stored using SMR and extended parity are shown. Each track 810 forms a concentric ring at a determined circumference. The curvature is not reflected due to the large difference between track width and circumference and only the segment near the start and end of each track is shown (not the entire track). As an example, track 810.1 has a track start 812.1 and a track end 814.1 and traverses a plurality of sectors in between. The data sectors would include a first data sector proximate track start 812.1 and a last data sector proximate track end 814.1. Track 810.1 also includes a set of parity sectors 816.1 including additional ECC parity data for the data sectors in track 810.1.

In the configuration shown, extended parity 818.1, corresponding to data sectors on track 810.1 and extending parity sectors 816.1, is not stored on track 810.1, but the next track 810.2. The delayed writing of extended parity to a following track during a sequential write operation may enable the data storage device to determine track squeeze and select a desired code rate and number of parity bits to be stored for that track. This configuration may allow the data storage device to use extended parity to dynamically adjust the available code rates for each data track based on write-time calculation of track squeeze and a correlation between PES and the desired code rate to compensate for the track squeeze. Each track, other than the initial track 810.1, may be configured to store its own parity sectors and extended parity from a prior track. For example, track 810.2 includes parity sector 816.2 (for itself) and extended parity 818.1 for track 810.1, track 810.3 includes parity sector 816.3 (for itself) and extended parity 818.2 for track 810.2, and so on, including next to last track 810.19, which includes parity sector 816.19 (for itself) and extended parity 818.18 for prior track 810.18. Extended parity may be determined on a per sector basis and the extended parity sector may provide a parity storage location for a series of extended parity bit sets for the data sectors, though these extended parity sectors may not include codewords. In the configuration shown, the final track 810.20 also includes parity sector 816.20 (for itself) and extended parity 818.19 for the prior track. The lack of a location to store extended parity for track 810.20 may not be a concern because the last track in the band is written without an overlapping track and, therefore should not be subject to track squeeze or need extended parity. Alternatively, extended parity for track 810.20 could be determined and stored in an alternate location, such as flash storage in the data storage device.

During a sequential write operation, each track may be written and its parity sectors calculated and written at the end of the track as normal. The write operation may also calculate the maximum extended parity for the track and store it temporarily in a parity buffer. The parity write logic may be configured to receive the PES signal from the track written and the next track being written to determine track squeeze. The PES signal comparison between the adjacent tracks may be used to index a parity configuration for extendible parity that correlates the track squeeze to a desired code rate and corresponding number of parity bits needed to support the desired code rate. This may be determined while writing the next track and/or its parity sectors and allow the parity write logic to select the desired code rate and number of extended parity bits for storage at the end of the next track. For example, track squeeze and corresponding desired code rate and extended parity bits for track 810.1 may be determined during the revolution for writing track 810.2, enabling the extended parity bits to be written in extended parity 818.1 at the end of track 810.2. In some configurations, track squeeze may be determined and extended parity may be calculated for each sector in the track. The sets of extended parity bits determined for each sector may be stored in one or more extended parity sectors included in the disk format for each track. An increased track skew 820 from the end of one set of extended parity to the start of the next set of extended parity (on the next track) may provide processing time for determining track squeeze and selecting the desired code rate and parity bits to be written at the end of that next track.

In some configurations, during a sequential read operation, each track may be read and decoded using its parity sectors during an initial pass. For example, track 810.1 would be decoded using the sets of parity bits in parity sectors 816.1, which may correspond to the set of primary parity bits for the data sectors. If this decode is successful, the sequential read operation may continue to the next track and use the same method, ignoring the extended parity that track contains for the prior track. If the decode is unsuccessful, the extended parity may be read from the end of the next track to be used for a second pass at decoding the track. In some configurations, the read head may return to the prior track to re-read the first track data for one or more attempts to decode the data sectors using the extended parity. In some configurations, particularly where track squeeze exceeds a threshold where decoding using only the parity sectors is unlikely to be successful, the read head may read the extended parity from the next track and buffer the extended parity data prior to reading the prior track.

Figure 9:
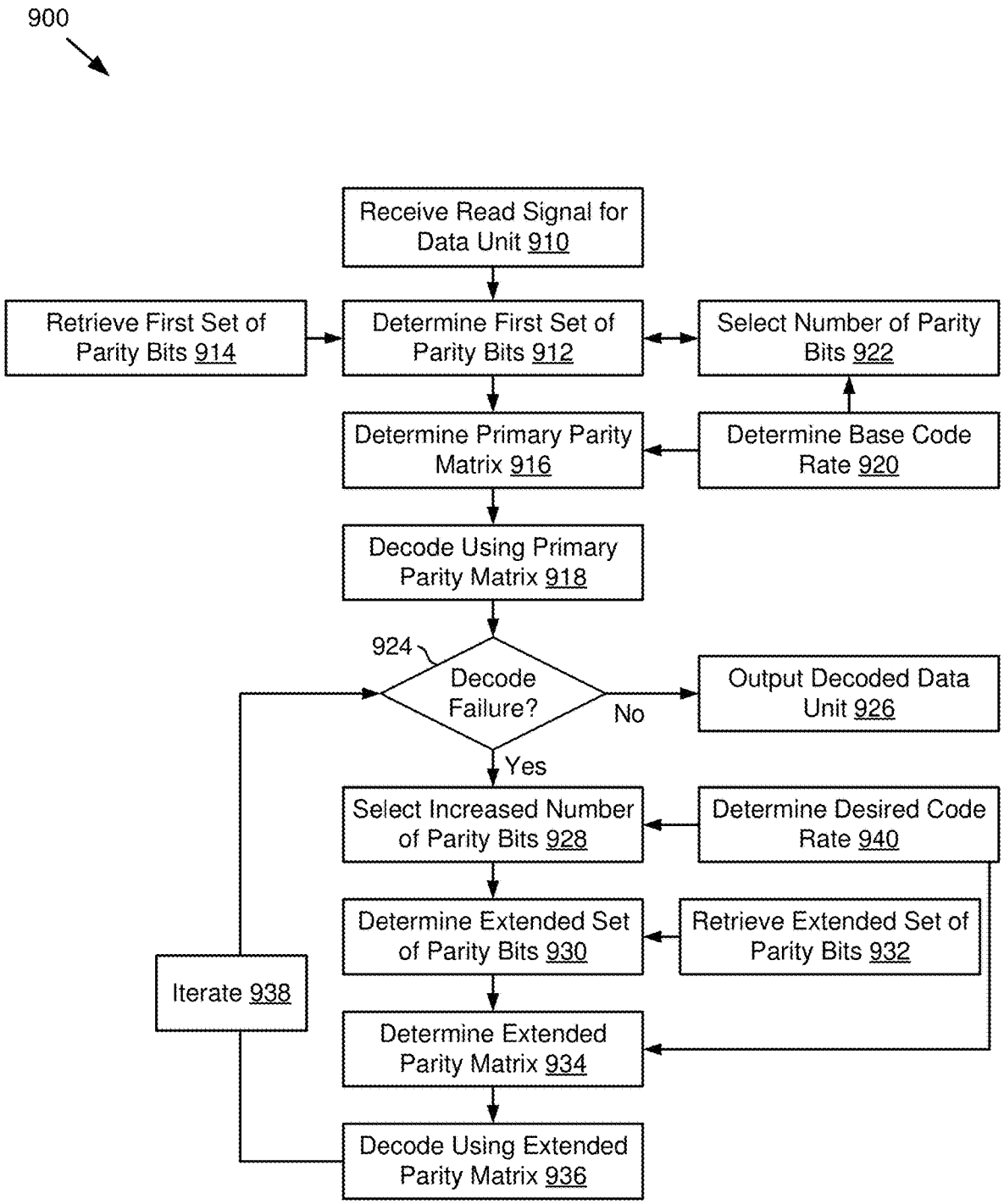
FIG. 9 is an example method of using extended parity bits and matrices to decode a target data unit.

As shown in FIG. 9, control circuitry 300 may be operated according to an example method of using extended parity bits and parity matrices to decode a target data unit, i.e., according to the method 900 illustrated by blocks 910-940. In some configurations, blocks 910-940 may be implemented by a read channel circuit controlled by a storage manager with parity read logic and decode retry logic.

At block 910, a read signal for a data unit may be received. For example, the read channel circuit may receive a read signal from a read head through an analog front end and buffer a digital read signal for the data unit for data detection and decoding.

At block 912, a first set of parity bits may be determined. For example, the read channel circuit may read a primary set of parity bits based on the codeword and/or including a set of extended parity bits corresponding to the data unit and add the set of parity bits to a parity buffer for use in decoding.

At block 914, the first set of parity bits may be retrieved. For example, the parity bits may not be included in the read signal and the read channel circuit may receive them according to parity read logic retrieving the parity bits from another parity storage location, such as parity data held in memory from another read signal or accessed in another non-volatile storage location, such as a flash memory within the data storage device.

At block 916, a primary parity matrix may be determined. For example, the read channel circuit may be configured with a plurality of parity matrices, including a primary parity matrix and one or more extended parity matrices, and may populate parity registers for the number of parity bits corresponding to the primary parity matrix.

At block 918, the data unit may be decoded using the primary parity matrix. For example, the read channel circuit may execute the primary parity matrix using read signal for the data unit and the first set of parity bits to decode the data bits in the data unit. Executing the primary parity matrix for a decode operation may include multiple iterations through the primary parity matrix based on soft information receeed from a SOVA detector (based on the read signal) and syndromes determined by the primary parity matrix.

At block 920, a base code rate may be determined for the primary parity matrix. For example, during configuration of the read channel circuit, the desired code rate may be determined for the primary parity matrix. At block 922, the number of parity bits corresponding to the base code rate may be selected. For example, during configuration of the read channel circuit, the number of parity bits corresponding to the base code rate may be determined and, during operation, the read channel circuit may select the first set of parity bits to equal the selected number of parity bits, even if more parity bits (e.g., extended parity bits) are available for the data unit.

At block 924, whether there has been a decode failure may be determined. For example, the read channel circuit may determine whether the decode using a set of parity bits and corresponding parity matrix successfully decoded the data unit within the error correction capabilities of the code rate used. If there is no decode failure, method 900 may proceed to block 926. If there is a decode failure (and there is one or more sets of parity data for the data unit that has not been attempted), method 900 may proceed to block 928.

At block 926, the decoded data unit may be output. For example, the read channel circuit may output the decoded bit data for the data unit to the storage manager or a host data buffer for assembling and returning the host data. In configurations using extended parity to decode parity sectors, the decoded parity data from the data unit may be output to parity buffers or registers within the read channel circuit or output to the parity read logic of the storage manager to be returned to the read channel circuit when needed for decoding a corresponding host data unit.

At block 928, an increased number of parity bits may be selected. For example, the read channel circuit may select a next higher increment of extended parity bits for a next decode operation.

At block 930, an extended set of parity bits may be determined. For example, the read channel circuit may read an extended set of parity bits from an extended parity sector for the data unit.

At block 932, the extended set of parity bits may be retrieved. For example, the parity bits may not be included in the read signal and the read channel circuit may receive them according to parity read logic retrieving the parity bits from another parity storage location, such as parity data held in memory from another read signal or accessed in another non-volatile storage location, such as a flash memory within the data storage device.

At block 934, an extended parity matrix may be determined. For example, the read channel circuit may select and populate the parity registers corresponding to the extended parity matrix that has the increased number of parity bits selected at block 928.

At block 936, the data unit may be decoded using the extended parity matrix. For example, the read channel circuit may execute the extended parity matrix using the read signal for the data unit and the extended set of parity bits to decode the data bits in the data unit. Executing the extended parity matrix for a decode operation may include multiple iterations through the extended parity matrix based on soft information received from a SOVA detector (based on the read signal) and syndromes determined by the extended parity matrix.

In some configurations, the read channel circuit may include multiple extensions of the primary parity matrix and may iterate through more than two parity matrices. At block 938, method 900 may continue to iterate through multiple parity extensions. Block 924 may provide an exit condition for iterating through blocks 928-936 until the data unit is successfully decoded or the read channel circuit reaches a maximum number of parity bits available for the data unit. For example, the read channel circuit may select extended sets of parity bits and attempt to decode the data unit with each sequential set of extended parity bits and extended parity matrices, increasing the code rate for each attempt until the data unit is decoded or no additional parity bits are available for the data unit.

At block 940, a desired code rate may be determined. For example, the read channel circuit may be configured with extended numbers of parity bits and corresponding extended parity matrices representing sequential increases in code rate and the read channel circuit and/or decode retry logic may increase the code rate to a next desired code rate to attempt the next decode operation.

Figure 10:
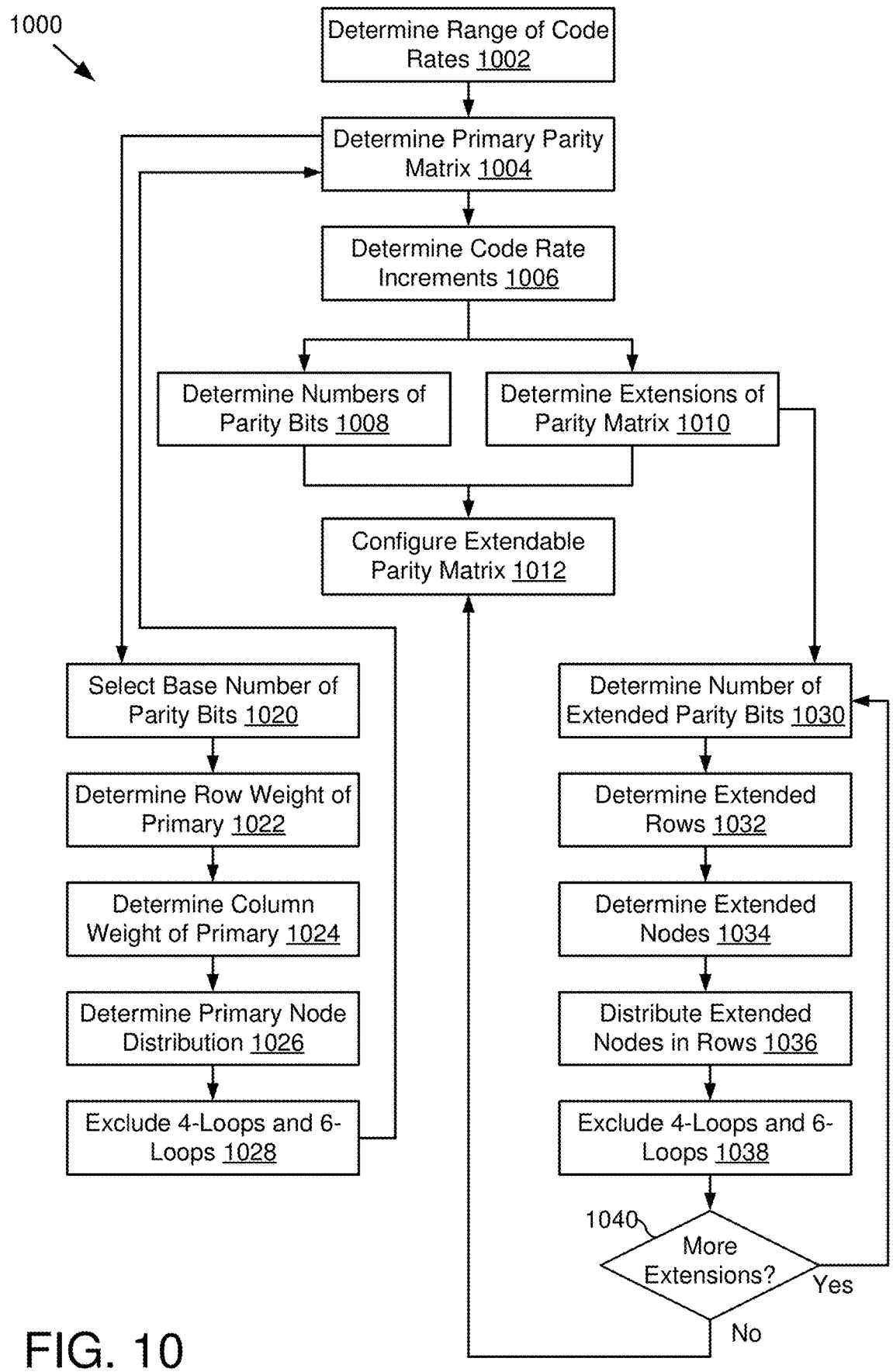
FIG. 10 is an example method of determining and configuring extendable parity matrices.

As shown in FIG. 10, control circuitry 300 may be configured according to an example method of determining and configuring extendable parity matrices, i.e., according to the method 1000 illustrated by blocks 1006-1040. In some configurations, blocks 1006-1040 may be implemented using a processor, memory, and circuit and/or firmware design tools configure a set of extended parity matrices and corresponding LDPC codes for a population of data storage devices.

At block 1002, a range of code rates may be determined. For example, the design tool may receive, from a user, maximum and minimum code rates to be supported by a data storage device.

At block 1004, a primary parity matrix may be determined. For example, the design tool may determine, based on user input, a primary parity matrix based on the minimum code rate to be used by the data storage device. Blocks 1020-1028 describe example steps for determining the primary parity matrix.

At block 1006, code rate increments may be determined. For example, the design tool may determine, based on user input, incremental code rates from the minimum to the maximum code rate, such as step increases of the code rate by a predetermined increment.

At block 1008, the number of parity bits may be determined. For example, the design tool may determine the number of parity bits needed to support the desired code rate at each increment.

At block 1010, extensions of the parity matrix may be determined. For example, the design tool may determine the corresponding node distributions needed for good LDPC codes to support each increment of parity bits. Blocks 1030-1040 describe example steps for determining extended parity matrices.

At block 1012, the extendable parity matrix may be configured for the data storage device. For example, based on the primary parity matrix and the set of extended parity matrices determined at blocks 1004 and 1010, the design tool may output an extendable parity matrix that uses incremental extensions based on using and extending the prior parity matrix for instantiation in hardware and/or firmware in a read channel circuit.

At block 1020, a base number of parity bits may be selected. For example, the design tool may select the number of parity bits corresponding to the minimum code rate from block 1002.

At block 1022, row weight may be determined for the primary parity matrix. For example, the design tool may select, based on user input, a row weight for the parity matrix.

At block 1024, column weight may be determined for the primary parity matrix. For example, the design tool may select, based on user input, column weights for the parity matrix.

At block 1026, the node distribution for the primary parity matrix may be determined. For example, the design tool may select, based on user input, a distribution of node locations across the rows and columns of the primary parity matrix for a valid LDPC code.

At block 1028, 4-loops and 6-loops may be excluded. For example, when the nodes are distributed at block 1026, an acceptance condition for the distribution may be that no 4-loops or 6-loops are present in the node distribution.

At block 1030, a number of extended parity bits may be determined. For example, the design tool may select the next increment of parity bits corresponding to the desired code rate increments of block 1006.

At block 1032, extended rows may be determined. For example, the design tool may extend the prior parity matrix by a number of rows equal to the number of extended parity bits.

At block 1034, extended nodes may be determined. For example, the design tool may determine a number of nodes per column to support a valid LDPC code.

At block 1036, the extended nodes may be distributed among the extended rows. For example, the design tool may select, based on user input, a distribution of node locations within the new rows added at block 1032 and compatible with the nodes of the prior parity matrix that is being extended.

At block 1038, 4-loops and 6-loops may be excluded. For example, when the new nodes are distributed at block 1036, an acceptance condition for the distributions may be that no 4-loops or 6-loops are present in the node distribution, including interactions between the new nodes and the existing nodes of prior parity matrix (which may not be changed).

At block 1040, if more extensions need to be configured, method 1000 may return to block 1030 for configuring the next extended parity matrix until all extensions of the parity matrix are determined and the maximum code rate is reached. Extensions may be based on a predetermined number of parity bits in each extension, such as 1, 3, or more parity bits.

Figure 11:
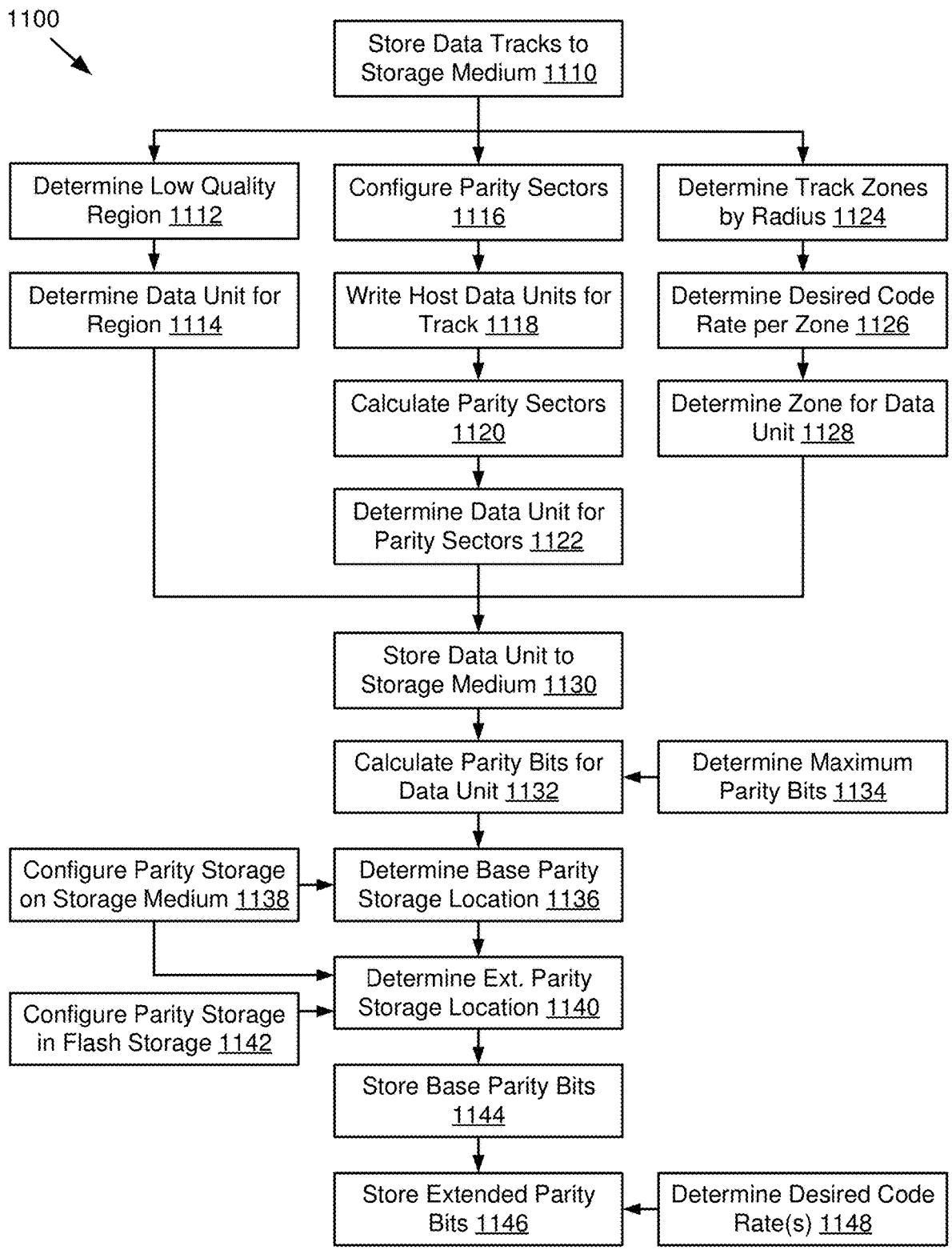
FIG. 11 is an example method of storing extended parity bits for desired code rates.

As shown in FIG. 11, control circuitry 300 may be operated according to an example method of storing extended parity bits for desired code rates, i.e., according to the method 1100 illustrated by blocks 1110-1148. In some configurations, blocks 1110-1148 may be implemented by a write channel circuit controlled by a storage manager with parity write logic. Blocks 1112-1114, 1116-1122, and 1124-1128 include some example use cases for extended parity.

At block 1110, data tracks may be stored to a storage medium. For example, the data storage device may be configured with a track configuration used by the storage manage to allocate host data to data tracks on the storage medium.

At block 1112, a low-quality region may be determined. For example, the storage manager may map low quality regions on the storage medium, such as media defects, by track, sector, or other physical location on the storage medium. Low-quality regions may be determined during disk scans and/or from high bit error rates during read operations from the region.

At block 1114, a data unit to be written to the region may be determined. For example, the storage manager may receive a host block to be written to the track or sector with the lower quality.

At block 1116, parity sectors may be configured. For example, the track configuration may include parity sectors containing parity data for the preceding host sectors on the data track and the parity sectors may be configured to be stored without a modulation code.

At block 1118, host data units may be written to a track. For example, the write channel circuit may generate a write signal to write host data sectors along the track during a write operation.

At block 1120, parity sectors may be calculated. For example, the write channel circuit may calculate parity for each host data sector as it is written and allocate the calculated parity data to at least one parity sector for the track.

At block 1122, a data unit to contain the parity sector may be determined. For example, the write channel circuit may select a set of parity data for each parity sector to be written.

At block 1124, zones or bands of tracks may be determined by track radius. For example, the track configuration may include groups of tracks in ranges of track radius (or circumference) that have similar bit densities and formats.

At block 1126, a desired code rate may be determined per zone or band. For example, a parity configuration for the storage medium may be configured for increasing code rates to compensate in variations in bit densities and formats from the OD to the ID.

At block 1128, a zone or band may be determined for a data unit. For example, the storage manager may receive a host block to be written to the storage medium and determine which zone or band the data unit will be written to.

At block 1130, the data unit may be stored to the storage medium. For example, the data units from blocks 1114, 1122, and/or 1128 may be written to the storage medium through the write channel circuit.

At block 1132. parity bits may be determined for the data unit. For example, as the data unit is written to storage medium, the write channel circuit may calculate parity for the data unit from the encoded data unit.

At block 1134, maximum parity bits may be determined. For example, the write channel circuit may be configured to calculate the maximum number of parity bits that could be needed for extended parity, which may be the number of parity bits for a known desired code rate or the maximum number of parity supporting the highest code rate for the extended parity (which allows the actual code rate and set of extended parity bits to be stored to be determined later).

At block 1136, a base parity storage location may be determined. For example, a uniform sized set of parity bits corresponding to a primary parity matrix may be stored for each data unit and the track configuration may include track space allocated to such parity sectors.

At block 1138, parity storage may be configured on the storage medium. For example, the track configuration may include allocations for the base parity data and/or one or more sets of extended parity data.

At block 1140, an extended parity storage location may be determined. For example, each data unit may also have corresponding extended parity bits to support higher code rates than the base set of parity bits and the parity write logic may be configured to select the appropriate storage location(s) for the extended parity data.

At block 1142, parity storage may be configured in flash storage. For example, the track configuration may not support one or more sets of parity data, such as the extended parity data sets, and the parity write logic may be configured to interface with flash storage in the data storage device for storing the parity data that does not have a parity storage location on the storage medium.

At block 1144, the base parity bits may be stored. For example, the parity write logic may store the base parity bits to the parity storage location determined at block 1136.

At block 1146, the extended parity bits may be stored. For example, the parity write logic may store one or more sets of extended parity data to the parity storage location(s) determined at block 1140.

At block 1148, desired code rates may be determined for the extended parity prior to storing the extended parity bits. For example, a desired code rate may be dynamically determined for the specific data unit and a set of bits corresponding to the desired code rate may be stored, even if that does not include all parity bits calculated at block 1132.

Figure 12:
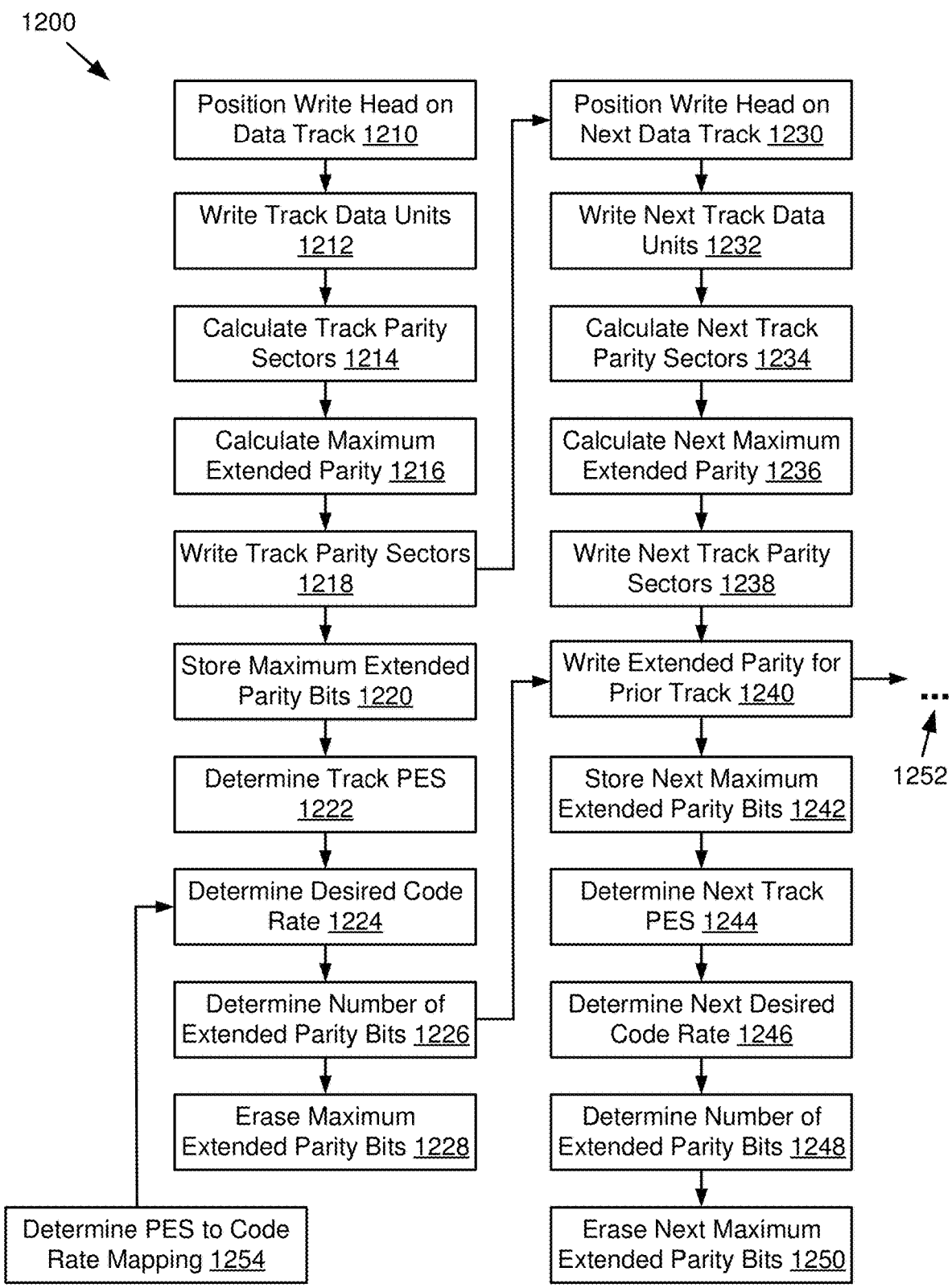
FIG. 12 is an example method of storing extended parity bits based on position error signals during sequential write operations.

As shown in FIG. 12, control circuitry 300 may be operated according to an example method of storing extended parity bits based on position error signals during sequential write operations, i.e., according to the method 1200 illustrated by blocks 1210-1254. In some configurations, blocks 1210-1254 may be implemented by a write channel circuit and servo controller controlled by a storage manager with parity write logic. In some configurations, method 1200 may be used with a data storage device configured for shingled magnetic recording.

At block 1210, a write head may be positioned on a data track. For example, a servo controller may position the write head for writing data to a first track in a band of tracks on the storage medium of the data storage device.

At block 1212, data units may be written to the track. For example, the write channel circuit may write host data sectors to the first track.

At block 1214, track parity sectors may be calculated. For example, the write channel circuit may calculate parity data for the host track sectors as they are written, including a base number of parity bits to be stored for each data sector in parity sectors at the end of the data track.

At block 1216, maximum extended parity may be calculated. For example, the write channel circuit may calculate parity data beyond that needed for the base number of parity bits in the parity sectors and including an extended number of parity bits out to a maximum number of parity bits supporting the highest code rate of the extended parity configuration.

At block 1218, the parity sectors may be written at the end of the data track. For example, the write channel circuit may write the parity sectors calculated at block 1214 to parity sectors at the end of the first track.

At block 1220, the maximum extended parity bits may be stored. For example, the write channel circuit and/or parity write logic may store the maximum set of extended parity bits (with or without the subset of parity bits written to the parity sectors) to a temporary parity buffer to await a determination of what extended parity should be stored to non-volatile memory.

At block 1222, track PES may be determined. For example, track PES may be collected from the servo controller and the PES of adjacent tracks may be compared to determine track squeeze and/or another write quality metric for the first track.

At block 1224, a desired code rate may be determined. For example, the write channel circuit and/or parity write logic may use the PES data to index a lookup table mapping PES data to desired code rates for reliably reading data in that track or sector.

At block 1226, a number of extended parity bits corresponding to the desired code rate may be determined. For example, the write channel circuit and/or parity write logic may select a number of extended parity bits corresponding to the desired code rate responsive to the PES data.

At block 1228, the maximum extended parity bits may be erased. For example, after the number of extended parity bits selected at block 1226 are written to non-volatile memory at block 1240, the parity buffer space used to store the extended parity bits at block 1220 may be erased and/or reused for buffering parity data for other data tracks.

At block 1230, the write head may be positioned on the next data track. For example, the servo controller may position the write head for writing data to the next track in the band of tracks for a sequential write operation.

At block 1232, data units may be written to the next track. For example, the write channel circuit may write host data sectors to the next track.

At block 1234, next track parity sectors may be calculated. For example, the write channel circuit may calculate parity data for the next track as it is written, including the base number of parity bits to be stored for each data sector in parity sectors at the end of the data track.

At block 1236, maximum extended parity may be calculated for the next track. For example, the write channel circuit may calculate parity data beyond that needed for the base number of parity bits for the parity sectors for the next data track.

At block 1238, the parity sectors may be written at the end of that track. For example, the write channel circuit may write the parity sectors calculated at block 1234 to parity sectors at the end of that track.

At block 1240, the extended parity for the prior track is written at the end that track. For example, the write channel circuit may write one or more extended parity sectors with the extended parity bits determined at block 1226 for the first track on the next track.

At block 1242, the maximum extended parity bits may be stored for that track. For example, the write channel circuit and/or parity write logic may store the maximum set of extended parity bits (with or without the subset of parity bits written to the parity sectors) to the temporary parity buffer to await the determination of what extended parity should be stored to non-volatile memory for that track.

At block 1244, track PES for the next track may be determined. For example, track PES may be collected from the servo controller and the PES of adjacent tracks may be compared to determine track squeeze and/or another write quality metric for the next track.

At block 1246, the next desired code rate may be determined. For example, the write channel circuit and/or parity write logic may use the PES data to index a lookup table mapping PES data to desired code rates for reliably reading data in that track or sector.

At block 1248, the number of extended parity bits corresponding to the desired code rate for the next track may be determined. For example, the write channel circuit and/or parity write logic may select the number of extended parity bits corresponding to the desired code rate responsive to the PES data.

At block 1250, the maximum extended parity bits may be erased. For example, after the number of extended parity bits selected at block 1236 are written to non-volatile memory with the following track (not shown), the parity buffer space used to store the extended parity bits at block 1242 may be erased and/or reused for buffering parity data for other data tracks.

At 1252, blocks 1230-1250 may be repeated for any number of tracks in the band, where each track stores its own parity sectors and the extended parity sectors of a prior track. For example, SMR track configurations may group tracks in bands for continuous writes and each track in the band may be written with reference to overlapping a prior track and using PES to assign appropriate extended parity based on track squeeze.

At block 1254, a PES to code rate and parity mapping may be determined. For example, the write channel circuit and/or parity write logic may be configured with a lookup table or similar data structure for converting PES values to desired code rates. This conversion may be experimentally determined or generated through modeling the resulting bit error rates (decreases in track quality) from track squeeze to map the PES data to a desired code rate that compensates for the decreased reliability of squeezed data.

Figure 13:
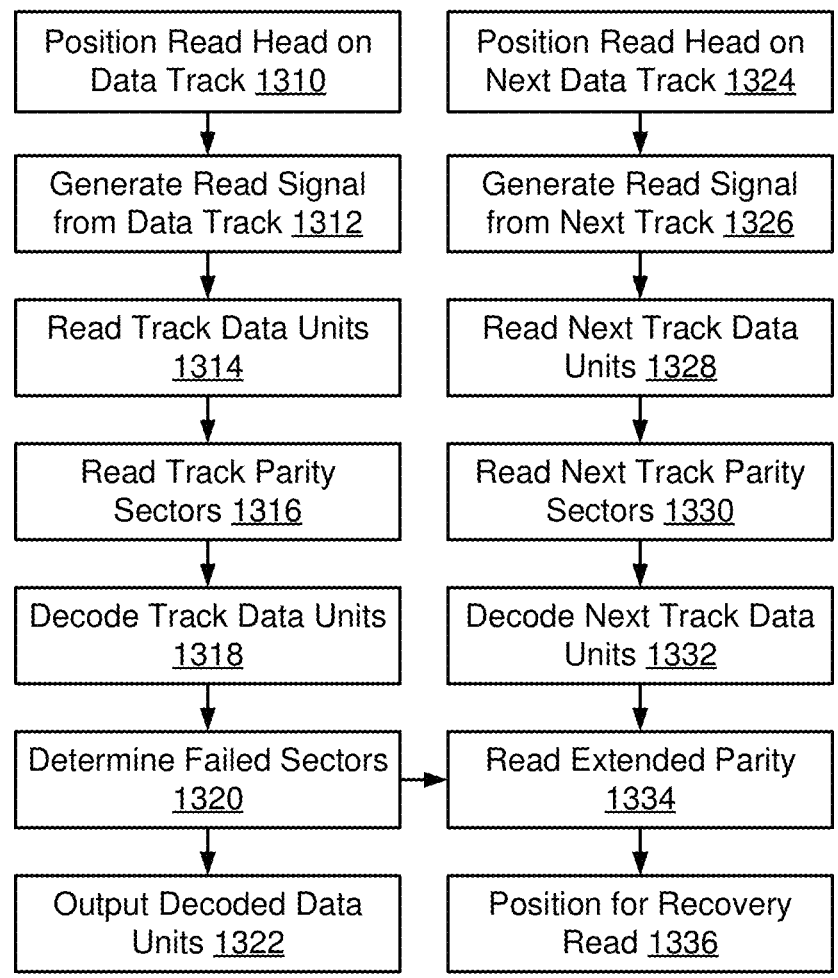
FIG. 13 is an example method of reading extended parity bits during sequential read operations.

As shown in FIG. 13, control circuitry 300 may be operated according to an example method of reading extended parity bits during sequential read operations, i.e., according to the method 1300 illustrated by blocks 1310-1336. In some configurations, blocks 1310-1336 may be implemented by a read channel circuit and servo controller controlled by a storage manager with parity read logic and decode retry logic. In some configurations, method 1300 may be used with a data storage device configured for shingled magnetic recording.

At block 1310, a read head may be positioned on a data track. For example, a servo controller may position the read head for reading data from a first track in a band of tracks on the storage medium of the data storage device.

At block 1312, the read head may generate a read signal from the data track. For example, the read channel circuit may apply a read voltage to the read head and receive an analog read signal from the read head.

At block 1314, data units may be read from the track. For example, the read channel circuit may convert the analog read signal to a digital read signal and sequentially process the data units through a detector and decoder.

At block 1316, track parity sectors may be read. For example, the read channel circuit may receive data units corresponding to parity sectors in the read signal and process them through the detector and decoder to determine a set of parity bits selectively used for decoding data units read at block 1314.

At block 1318, track data units may be decoded using parity sectors. For example, the read channel circuit may use the sets of parity bits decoded from the parity sectors to do additional decoding of sectors.

At block 1320, failed sectors may be determined. For example, the parity data in the parity sectors may be insufficient for recovering all sectors in the track and the read channel circuit and/or decode retry logic.

At block 1322, decoded data units may be output. For example, successfully decoded tracks may be output by the read channel circuit without using extended parity.

At block 1324, the read head may be positioned on the next track. For example, a servo controller may position the read head for reading data from the next track in a band of tracks for the sequential read.

At block 1326, the read head may generate a read signal from the next track. For example, the read channel circuit may apply the read voltage to the read head and receive an analog read signal from the read head for the next track At block 1328, data units may be read from the next track. For example, the read channel circuit may receive the read signal and sequentially process the data units through the detector and decoder.

At block 1330, track parity sectors may be read for the next track. For example, the read channel circuit may receive data units corresponding to parity sectors for the next track and process them through the detector and decoder to determine a set of parity bits selectively used for decoding data units read at block 1328.

At block 1332 track data units from the next track may be decoded using parity sectors. For example, the read channel circuit may use the sets of parity bits decoded from the parity sectors to do additional decoding of sectors.

At block 1320, extended parity may be read from the next track. For example, the next track may include extended parity sectors for the first track and the extended parity sectors may be read if failed sectors were determined at block 1320.

At block 1336, the read head may be positioned back over the first track for a recovery read. For example, if the read channel circuit does not have sufficient sector/track buffering memory to retain the undecoded data units from the first track through the reading and processing of the next track, the data units from the first track may be re-read and processed using the extended parity data read at block 1334.

In an alternate configuration, the read head may be positioned on the second track and extended parity may be read prior to positioning the read head for the first read at block 1310.

Figure 14:
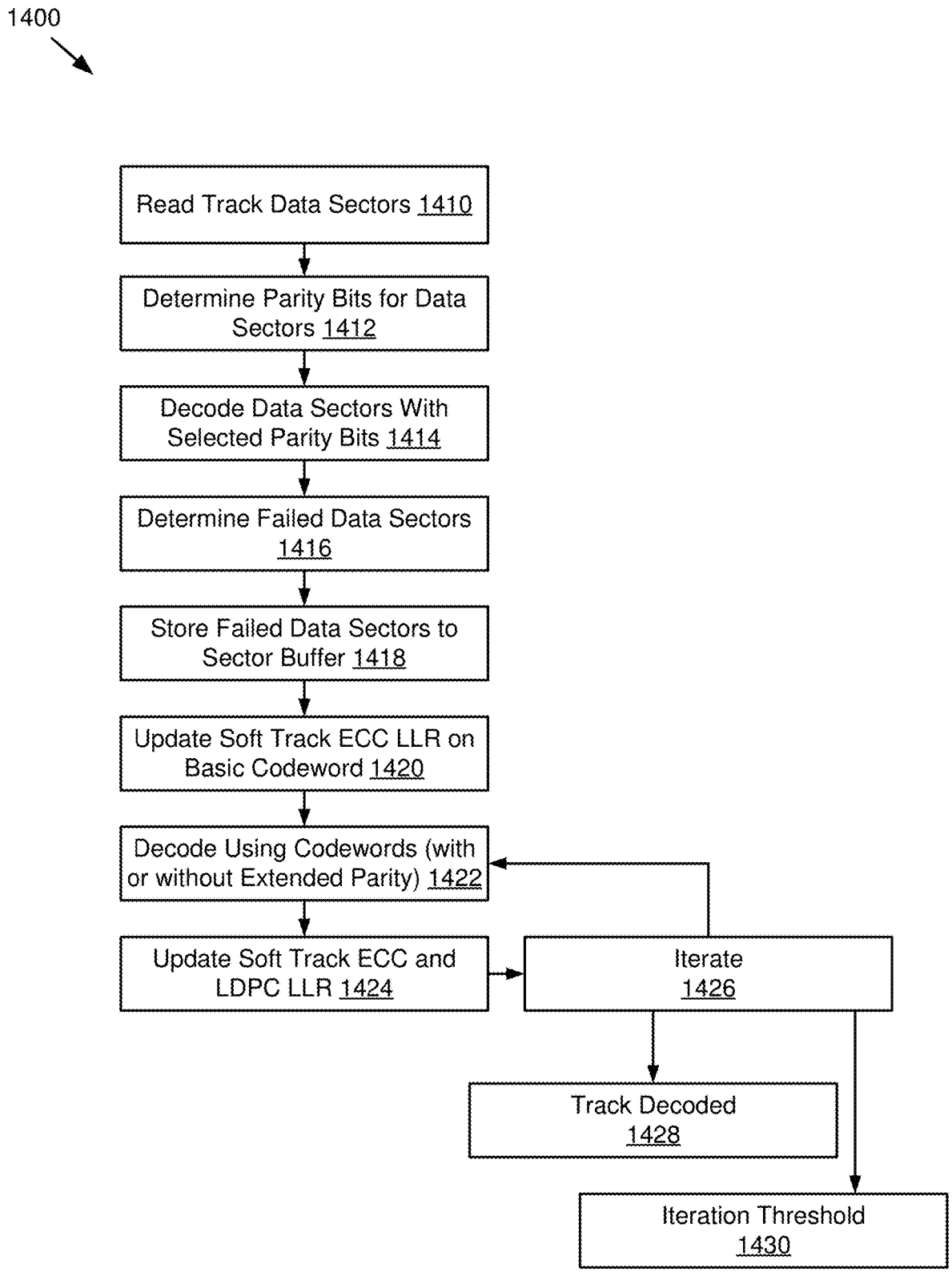
FIG. 14 is an example method of using extended parity with soft track error correction codes.

As shown in FIG. 14, control circuitry 300 may be operated according to an example method of using extended parity with soft track error correction codes, i.e., according to the method 1400 illustrated by blocks 1410-1430. In some configurations, blocks 1410-1430 may be implemented by a read channel circuit.

At block 1410, track data sectors may be read. For example, the read channel may be configured to process a track at a time during read operations and may sequentially read all data sectors in a logical data track.

At block 1412, the parity bits for the data sectors may be determined. For example, some data sectors may only include base codewords while others may include extended parity bits of varying numbers and the read channel may determine the corresponding number of parity bits for each data sector as it is read.

At block 1414, the data sectors may be decoded (or attempted) with the selected parity bits. For example, each data sector, whether or not it includes extended parity bits, may be decoded using the corresponding parity matrix, whether the primary matrix for base codewords or one or more extended parity matrices for data sectors with extended parity bits.

At block 1416, failed data sectors may be determined. For example, not all data sectors may be successfully decoded during the initial ECC decoding, even with extended parity, and the read channel may determine one or more failed data sectors for further processing.

At block 1418, the failed data sectors may be stored to a sector buffer. For example, the read channel may include a sector buffer memory for holding failed data sectors for iterative processing using soft track ECC.

At block 1420, soft track ECC LLR may be updated based on basic codewords. For example, the read channel may initiate the iterative soft track ECC processing by providing initial soft information, such as LLR values, from the prior LDPC processing to the soft track ECC processor.

At block 1422, decoding of the failed data sectors may be attempted using codewords with or without extended parity. For example, the read channel may process the failed data sectors based on the codewords and/or extended parity read for the data sectors and additional parity data from track parity sectors.

At block 1424, soft track ECC and LDPC LLR values may be updated. For example, the read channel may update soft information for each iteration through the soft track ECC processor.

At block 1426, blocks 1422 and 1424 may be iterated until an exit condition is met. For example, if all failed data sectors are successfully decoded, the data track may be decoded and output at block 1426. If all failed data sectors are not successfully decoded before an iteration threshold is met at block 1430, such as a maximum time or number of iterations configured for the soft track ECC processor, then soft track ECC processing may end with an error condition that may trigger a read error and/or further error recovery attempts.

Technology for improved data reliability and/or format efficiency using differentiated code rates supported by extended parity matrices and parity data is described. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A channel circuit, comprising:
   an error correction code processor configured to:
   receive a read signal for a data unit;
   determine a second set of parity bits for the data unit, wherein the second set of parity bits has a second number of parity bits that is configured to be greater than a first number of parity bits of a first set of parity bits for the data unit;
   determine, based on the second set of parity bits, an extended parity matrix, wherein:
      a primary parity matrix based on the first set of parity bits comprises a first set of nodes;
      the extended parity matrix comprises a second set of nodes that include the first set of nodes and additional nodes corresponding to additional parity bits in the second set of parity bits;
      the nodes of the primary parity matrix and the extended parity matrix correspond to matrices for scaling to a bit matrix for a size of the data unit; and
      the extended parity matrix includes at least one node cluster corresponding to a difference between the first number of parity bits and the second number of parity bits;
   decode, based on the extended parity matrix, the data unit from the read signal; and
   output a decoded data unit based on the data unit from the read signal.

2. The channel circuit of claim 1, further comprising:
   a parity selector configured to:
   select, from a plurality of numbers of parity bits, a selected number of parity bits corresponding to a desired code rate for a decode operation for the data unit; and
   determine, based on the selected number of parity bits and from a plurality of parity matrices, a parity matrix corresponding to the selected number of parity bits, wherein the plurality of parity matrices corresponds to a series of incremental extensions of the primary parity matrix based on incremental increases of the number of parity bits.

3. The channel circuit of claim 2, wherein:
   the incremental increases in the number of parity bits corresponds to a predetermined increase in code rate;
   the plurality of parity matrices includes equivalent nodes from prior parity matrices in the series of incremental extensions;
   the parity matrix for the selected number of parity bits includes a number of node clusters equal to a number of incremental extensions for the selected number of parity bits; and
   the node clusters are a multiple of an increment size of the series of incremental extensions.

4. The channel circuit of claim 2, wherein the plurality of parity matrices includes at least two incremental extensions in the series of incremental extensions of the primary parity matrix.

5. The channel circuit of claim 1, wherein:
   a row weight of the primary parity matrix equals a row weight of the extended parity matrix;
   a column weight of the extended parity matrix is greater than a column weight of the primary parity matrix; and
   additional nodes corresponding to the greater column weight of the extended parity matrix are distributed among additional rows in the extended parity matrix.

6. The channel circuit of claim 1, wherein:
   the primary parity matrix excludes 4-loops and 6-loops; and
   the extended parity matrix excludes 4-loops and 6-loops.

7. The channel circuit of claim 1, wherein:
   the error correction code processor is further configured to:
   determine the first set of parity bits;
   determine the primary parity matrix; and
   decode, using the primary parity matrix, the data unit; and
   determining the second set of parity bits, determining the extended parity matrix, and decoding based on the extended parity matrix are responsive to a failure to decode using the primary parity matrix.

8. A data storage device comprising the channel circuit of claim 1, further comprising a storage medium comprised of a plurality of data tracks, wherein the read signal is configured to be generated from the plurality of data tracks.

9. The data storage device of claim 8, further comprising a plurality of parity sectors stored on the storage medium, wherein:
   the plurality of parity sectors includes parity bits for host data units in the plurality of data tracks; and
   the data unit includes a parity sector of the plurality of parity sectors.

10. The data storage device of claim 8, further comprising:
    a first region of the storage medium;
    a second region of the storage medium, wherein:
    the first region of the storage medium has a first bit error rate;
    data units in the first region have corresponding sets of parity bits of the first number of parity bits;
    the second region of the storage medium has a second bit error rate that is higher than the first bit error rate; and
    data units in the second region have corresponding sets of parity bits of the second number of parity bits.

11. The data storage device of claim 10, wherein at least one configuration is selected from:
    the first region is a first zone with a first bit density and the second region is a second zone with a second bit density;
    the first region is a first group of tracks within the first zone and the second region is a second group of tracks within the first zone; and
    the first region is a first data sector in a track in the first zone and the second region is a second data sector in the track in the first zone.

12. A method comprising:
    receiving a read signal for a data unit;
    determining a second set of parity bits for the data unit, wherein the second set of parity bits has a second number of parity bits that is configured to be greater than a first number of parity bits of a first set of parity bits for the data unit;

determining, based on the second set of parity bits, an extended parity matrix, wherein:
  a primary parity matrix based on the first set of parity bits comprises a first set of nodes;
  the extended parity matrix comprises a second set of nodes that include the first set of nodes and additional nodes corresponding to additional parity bits in the second set of parity bits;
  the nodes of the primary parity matrix and the extended parity matrix correspond to matrices for scaling to a bit matrix for a size of the data unit; and
  the extended parity matrix includes at least one node cluster corresponding to a difference between the first number of parity bits and the second number of parity bits;

decoding, based on the extended parity matrix, the data unit from the read signal; and outputting a decoded data unit based on the data unit from the read signal.

13. The method of claim 12, further comprising:
selecting, from a plurality of numbers of parity bits, a selected number of parity bits corresponding to a desired code rate for a decode operation for the data unit; and
determining, based on the selected number of parity bits and from a plurality of parity matrices, a parity matrix corresponding to the selected number of parity bits, wherein the plurality of parity matrices corresponds to a series of incremental extensions of the primary parity matrix based on incremental increases of the number of parity bits.

14. The method of claim 13, wherein:
the incremental increases in the number of parity bits corresponds to a predetermined increase in code rate;
the plurality of parity matrices includes equivalent nodes from prior parity matrices in the series of incremental extensions;
the parity matrix for the selected number of parity bits includes a number of node clusters equal to a number of incremental extensions for the selected number of parity bits; and
the node clusters are a multiple of an increment size of the series of incremental extensions.

15. The method of claim 13, wherein the plurality of parity matrices includes at least two incremental extensions in the series of incremental extensions of the primary parity matrix.

16. The method of claim 12, wherein:
a row weight of the primary parity matrix equals a row weight of the extended parity matrix;
a column weight of the extended parity matrix is greater than a column weight of the primary parity matrix; and
additional nodes corresponding to the greater column weight of the extended parity matrix are distributed among additional rows in the extended parity matrix.

17. The method of claim 12, wherein:
the primary parity matrix excludes 4-loops and 6-loops; and
the extended parity matrix excludes 4-loops and 6-loops.

18. The method of claim 12, further comprising:
determining the first set of parity bits;
determining the primary parity matrix; and
decoding, using the primary parity matrix, the data unit, wherein determining the second set of parity bits, determining the extended parity matrix, and decoding based on the extended parity matrix are responsive to a failure to decode using the primary parity matrix.

19. The method of claim 12, further comprising:
storing, on a storage medium, a plurality of data tracks;
storing, on the storage medium, a plurality of parity sectors corresponding to the plurality of data tracks, wherein:
  the plurality of parity sectors includes parity bits for host data units in the plurality of data tracks; and
  the data unit includes a parity sector of the plurality of parity sectors; and
generating, from the storage medium, the read signal.

20. The method of claim 12, further comprising:
storing, on a storage medium, a plurality of data tracks, wherein:
  a first region of the storage medium has a first bit error rate;
  data units in the first region have corresponding sets of parity bits of the first number of parity bits;
  a second region of the storage medium has a second bit error rate that is higher than the first bit error rate; and
  data units in the second region have corresponding sets of parity bits of the second number of parity bits.

21. A data storage device comprising:
a storage medium comprising a plurality of data tracks;
means for receiving, from the storage medium, a read signal for a data unit;
means for determining a second set of parity bits for the data unit, wherein the second set of parity bits has a second number of parity bits that is configured to be greater than a first number of parity bits of a first set of parity bits for the data unit;
means for determining, based on the second set of parity bits, an extended parity matrix, wherein:
  a primary parity matrix based on the first set of parity bits comprises a first set of nodes;
  the extended parity matrix comprises a second set of nodes that include the first set of nodes and additional nodes corresponding to additional parity bits in the second set of parity bits;
  the nodes of the primary parity matrix and the extended parity matrix correspond to matrices for scaling to a bit matrix for a size of the data unit; and
  the extended parity matrix includes at least one node cluster corresponding to a difference between the first number of parity bits and the second number of parity bits;
means for decoding, based on the extended parity matrix, the data unit from the read signal; and
means for outputting a decoded data unit based on the data unit from the read signal.

* * * * *